United States Patent
Yamazaki et al.

(10) Patent No.: US 6,326,249 B1
(45) Date of Patent: *Dec. 4, 2001

(54) SEMICONDUCTOR DEVICE AND PROCESS FOR PRODUCING SAME

(75) Inventors: Shunpei Yamazaki, Tokyo; Akiharu Miyanaga, Kanagawa; Toru Mitsuki, Kanagawa; Hisashi Ohtani, Kanagawa, all of (JP)

(73) Assignee: Semiconductor Energy Laboratory Co., Ltd., Kanagawa-ken (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/139,662

(22) Filed: Aug. 25, 1998

(30) Foreign Application Priority Data

Aug. 26, 1997 (JP) .................................................. 9-246067
May 8, 1998 (JP) ................................................ 10-125956
May 20, 1998 (JP) ................................................ 10-156698

(51) Int. Cl.$^7$ .................................................. H01L 21/00
(52) U.S. Cl. ........................... 438/158; 438/159; 438/166
(58) Field of Search .................................. 438/158, 159, 438/160, 166, 486

(56) References Cited

U.S. PATENT DOCUMENTS

| | | | |
|---|---|---|---|
| 4,825,335 | * | 4/1989 | Winer .................................... 361/283 |
| 5,221,365 | | 6/1993 | Noguchi et al. . |
| 5,365,080 | | 11/1994 | Yamazaki et al. . |
| 5,403,772 | | 4/1995 | Zhang et al. . |
| 5,563,426 | | 10/1996 | Zhang et al. . |
| 5,604,360 | | 2/1997 | Zhang et al. . |
| 5,619,054 | | 4/1997 | Hashimoto . |
| 5,643,826 | | 7/1997 | Ohtani et al. ........................... 437/88 |
| 5,648,277 | | 7/1997 | Zhang et al. ............................ 437/21 |
| 5,670,812 | * | 9/1997 | Adler et al. ........................... 257/350 |
| 5,747,830 | * | 5/1998 | Okita ...................................... 257/72 |
| 5,882,960 | | 3/1999 | Zhang et al. . |
| 5,888,857 | | 3/1999 | Zhang et al. . |
| 5,895,933 | | 4/1999 | Zhang et al. ............................ 257/49 |
| 5,923,962 | | 7/1999 | Ohtani et al. . |
| 5,942,768 | | 8/1999 | Zhang . |
| 5,986,330 | | 11/1999 | Kalnitsky et al. . |
| 6,037,635 | * | 3/2000 | Yamazaki ............................. 257/333 |
| 6,084,290 | | 7/2000 | Shields . |
| 6,107,639 | | 8/2000 | Yamazaki et al. . |

FOREIGN PATENT DOCUMENTS

| | | |
|---|---|---|
| 07-045519 | 2/1995 | (JP) . |
| 07-130652 | 5/1995 | (JP) . |
| 07-135318 | 5/1995 | (JP) . |
| 07-321339 | 12/1995 | (JP) . |
| 08-078329 | 3/1996 | (JP) . |
| 08-213634 | 8/1996 | (JP) . |

OTHER PUBLICATIONS

H. Ohtani et al., "Late–New Poster: A 60–in. HDTV Rear–Projector With Continuous–Grain–Silicon Technology," SID Digest, May 1998, pp. 467–470.
H. Ohtani et al., "Late–New Poster: A 60 in HDTV Rear–Projector With Continuous–Grain Silicon Technology", SID Digest, May, 1998, pp. 467–470.
U.S. Patent Application Serial No. 09/596,011.

* cited by examiner

*Primary Examiner*—Richard Elms
*Assistant Examiner*—Michael S. Lebentritt
(74) *Attorney, Agent, or Firm*—Eric J. Robinson; Nixon Peabody LLP

(57) ABSTRACT

A semiconductor device comprising a substrate having an insulating surface layer and an active layer comprising a semiconductor thin film formed thereon, wherein the substrate and the insulating surface layer in contact with the substrate each has at least one concave part, and the influence of the concave part is removed by conducting a flattening treatment and heat treatment of the undercoat film of the semiconductor thin film.

36 Claims, 22 Drawing Sheets

Peripheral circuit (CMOS circuit) | Pixel matrix circuit

CMOS circuit | Pixel matrix circuit

CMOS circuit | Pixel matrix circuit

FIG. 14A

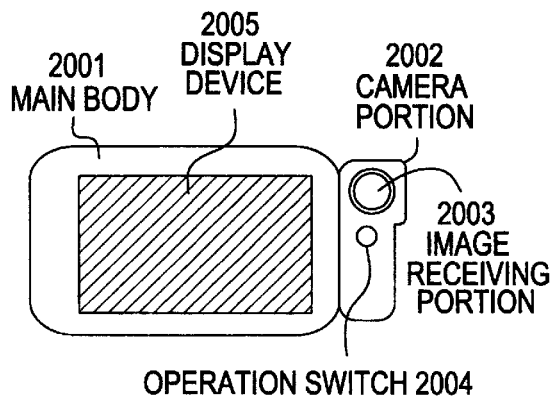

- 2001 MAIN BODY
- 2005 DISPLAY DEVICE
- 2002 CAMERA PORTION
- 2003 IMAGE RECEIVING PORTION
- OPERATION SWITCH 2004

FIG. 14B

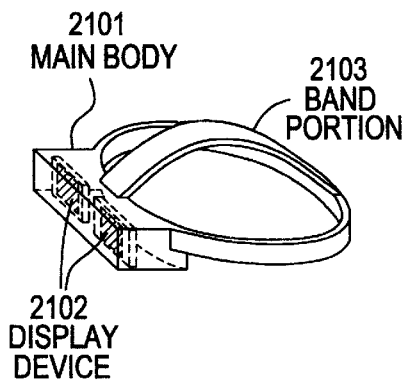

- 2101 MAIN BODY
- 2103 BAND PORTION
- 2102 DISPLAY DEVICE

FIG. 14C

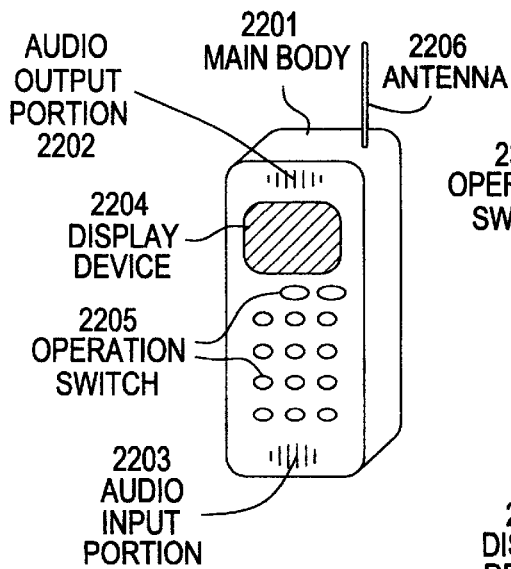

- AUDIO OUTPUT PORTION 2202
- 2201 MAIN BODY
- 2206 ANTENNA
- 2204 DISPLAY DEVICE
- 2205 OPERATION SWITCH
- 2203 AUDIO INPUT PORTION

FIG. 14D

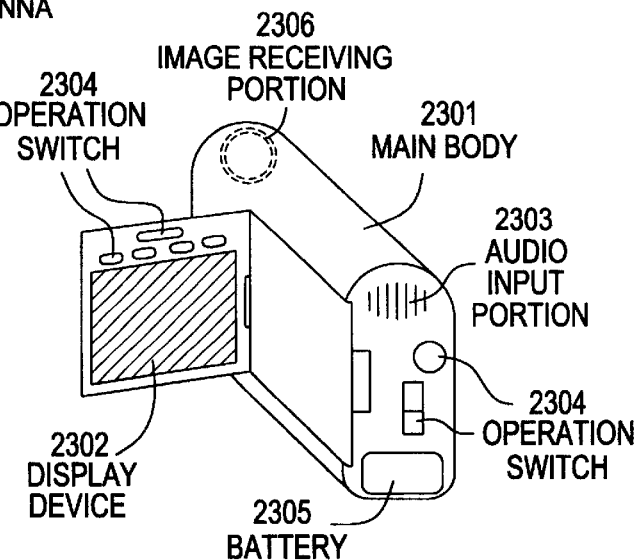

- 2306 IMAGE RECEIVING PORTION
- 2304 OPERATION SWITCH
- 2301 MAIN BODY
- 2303 AUDIO INPUT PORTION
- 2304 OPERATION SWITCH
- 2302 DISPLAY DEVICE
- 2305 BATTERY

FIG. 14E

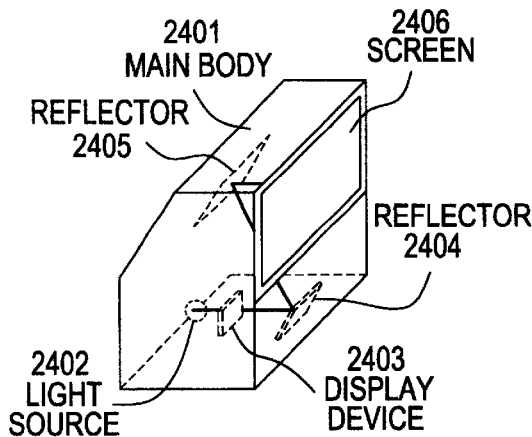

- 2401 MAIN BODY
- 2406 SCREEN
- REFLECTOR 2405
- REFLECTOR 2404
- 2402 LIGHT SOURCE
- 2403 DISPLAY DEVICE

FIG. 14F

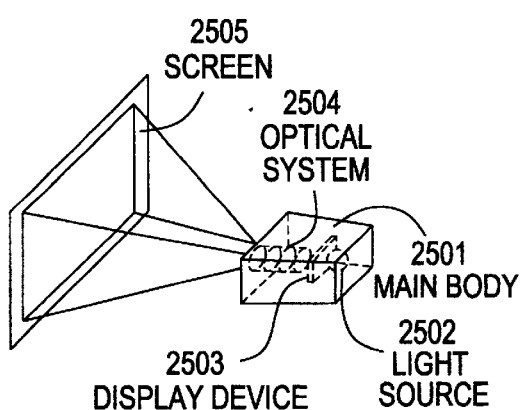

- 2505 SCREEN
- 2504 OPTICAL SYSTEM
- 2501 MAIN BODY
- 2503 DISPLAY DEVICE
- 2502 LIGHT SOURCE

SEMICONDUCTOR DEVICE AND PROCESS FOR PRODUCING SAME

FIELD OF THE INVENTION

The present invention relates to a structure of a semiconductor device in which thin film transistors (abbreviated as TFT hereinafter) are arranged on a substrate having an insulating surface layer. The semiconductor device used herein means devices that function by using semiconductors, and electro-optical devices, semiconductor circuits and electronic devices are all included therein.

BACKGROUND OF THE INVENTION

Recently, techniques are being quickly developed that a TFT is formed on a substrate having an insulated surface to constitute an electric circuit. Currently, there are many examples which a TFT is used as a switching element of a liquid crystal display device (liquid crystal panel). An active layer, which is the most important part of a TFT, is formed by a semiconductor thin film. While an amorphous silicon film has been frequently used as the semiconductor thin film, a polysilicon film is becoming the main current according to demands of a TFT having a higher operation speed.

A TFT using a polysilicon film (polysilicon TFT) is classified into a high temperature polysilicon TFT and a low temperature polysilicon TFT depending on the processing temperature. While both of them have been manufactured as commercial products, currently, the high temperature polysilicon TFT having reliability and stable characteristics occupies a wide range of the market.

In case that a high temperature polysilicon film is used as an active layer, the crystallinity of the polysilicon film is generally improved by subjecting a heat treatment at a temperature of about from 800° to 1,000° C. For that reason, a quartz substrate having high heat resistance is used as a substrate. Several millions of TFTs which correspond to several liquid crystal panels are usually formed on one quartz substrate so as to improve the throughput by producing plural devices.

In the case that several millions of TFTs are formed on one large substrate to produce plural devices, it is desired that all the TFTs formed on a substrate have the uniform characteristics and normal operation.

In case that several millions of TFTs are formed on a large substrate, it occurs irregular characteristics and defective operation of the TFT under the present circumstances. As a result of SEM and TEM observations of the defects by the inventors, they have been observed in the active layer, which is a factor of the defective operation of the TFT. FIG. 5B shows these defects of a TEM photograph in a schematic cross sectional diagram.

When the inventors observed the surface of low grade quartz substrate which is marketed in low price by an AFM (atomic force microscope), they found many large holes (concave parts having an average depth D of from 70 to 100 nm) dispersed at random on the surface of the substrate as shown in FIG. 15A. In FIG. 15A, the large holes can be found as black spots. The quartz substrate which is marketed in low price has an Rms of from 1 to 1.5 nm and the density of the holes (concave parts) is larger than 10,000 per square centimeter.

In case that the density of the holes (concave parts) is larger than 10,000 per square centimeter, it is known by the inventors experiment that crystal growth is prevented.

The concave part of the substrate which is coming into question has such a shape shown in FIG. 5A that the width of the upper part of the opening $r_2$ (opening diameter) is slightly smaller than the width of the inner part, and the radius of curvature $R_2$ at the opening at the upper part of the concave part of the substrate is small. The cross sectional curve at the opening by AFM observation exhibits a steep gradient. The cross sectional curve used herein is a curve obtained by TEM observation or AFM observation when cut at a plane perpendicular to the surface of the substrate.

The inventors have found that the reason of defects depends upon the shape (size and depth) of the large concave parts caved in the surface of low grade substrate which is marketed in low price.

In the conventional process, a semiconductor thin film 110 is directly formed on the surface of a substrate 100 as shown in FIG. 5A. Accordingly, the concave parts which has the substantially same radius of curvature as the radius of curvature at the opening 190 of the concave part on the surface of the substrate is formed on the surface of the semiconductor thin film at the upper part of the concave part in the surface of the substrate. In the step of crystallization of an amorphous silicon film and the step of heat treatment, which are the subsequent manufacturing steps of a TFT, these concave parts having a small radius of curvature at the opening inhibit the crystallization of an amorphous silicon film.

In the miniature unevenness at the bottom of the concave part of the substrate shown in FIG. 5A, solids incline to be formed in the crystallization step, and the semiconductor thin film is cut off to occur the defective operation as shown in FIG. 5B. The defect which the semiconductor thin film is cut off is called silicon cutout. As an EDX observation of the solids formed in the concave part to investigate the composition, it is found that they are silicides formed by segregation of catalytic elements.

It is evident as described above that in case that a semiconductor thin film is formed on a low-priced substrate having large holes caving in the surface (concave parts having miniature unevenness on the bottom) to produce a TFT, defects are appeared to cause irregular characteristics of TFT and deterioration of yield.

In case that low grade substrate which is marketed in low price is used, silicon cutout occurs by the concave parts on the substrate, which becomes a factor of defective operation of a TFT.

Although a substrate having a surface that is flattened by a special polishing method (Rms of from 0.4 to 0.6 nm) is also marketed as shown in FIG. 15B, it is expensive and is not industrially suitable for a mass production. The observed area of FIGS. 15A and 15B is $10 \times 10$ $\mu m^2$.

Thus, it is the biggest problem to reduce the defects such as silicon cutout and so, which is a factor of defective operation of a TFT, without using the expensive substrate.

SUMMARY OF THE INVENTION

An object of the invention is to provide a uniform semiconductor thin film by relieving the influence of the concave parts of the low-priced substrate to the semiconductor thin film with the undercoat film of the invention. Another object of the invention is to provide a semiconductor device having no defective operation using a semiconductor thin film with a good quality formed on the undercoat film of the invention.

The first constitution of the present invention is described as follows:

in a semiconductor device comprising a substrate having an insulating film on its surface and an active layer comprising a semiconductor thin film formed thereon, which characteristics are both of the substrate and the surface of the insulating film in contact with the substrate have at least one concave part, and an average value of a depth of the concave part of the surface of the insulating film, d, and an average value of a depth of the concave part of the surface of the substrate, D, satisfy d/D<1.

In the above first constitution, the average value of the depth of the concave part, d (the average value of the depth from the surface of the insulating film to the bottom of the concave part of the surface of the insulating film) is 10 nm or less.

The second constitution of the present invention is described as follows:

in a semiconductor device comprising a substrate having an insulating film on its surface and an active layer comprising a semiconductor thin film formed thereon, which characteristics are, the surface of insulating film in contact with the substrate has at least one concave part, and the concave part of the surface of the insulating layer has an opening diameter $r_1$ of form 10 nm to 1 µm.

The third constitution of the present invention is described as follows:

in a semiconductor device comprising a substrate having an insulating film on its surface and an active layer comprising a semiconductor thin film formed thereon, which characteristics are, the surface of the insulating film in contact with the substrate has at least one concave part, and an angle a° formed by a tangent line at an opening of the concave part of the surface of the insulating film and a surface plane is from 0° to 60°.

The fourth constitution of the present invention is described as follows:

in a semiconductor device comprising a substrate having an insulating film on its surface and an active layer comprising a semiconductor thin film formed thereon, which characteristics are, both of the substrate and the surface of the insulating film in contact with the substrate have at least one concave part, and a radius of curvature around an opening of the concave part of the insulating surface layer $R_1$ is larger than a radius of curvature around an opening of the concave part of the substrate $R_2$.

The radius of curvature R used herein is a radius of a circle of curvature at a certain point of the curve of the opening at the upper part of the concave part (a circle in contact with the curve at the concave part thereof).

In the first to fourth constitution of the invention, a density of the concave part having an inner surface is 100 per square centimeter or less.

The fifth constitution of the present invention is described as follows:

in a semiconductor device comprising a substrate having an insulating film on its surface and an active layer comprising a semiconductor thin film formed thereon, which characteristics are, an insulating film in contact with a bottom of the semiconductor thin film which square root of mean square of surface roughness Rms is 0.3 nm or less.

The square root of means square of surface roughness Rms used herein means a square root of an average of means square of deviations from the standard plane to the designated plane. The designated plane used herein means a plane to be measured for roughness, and the standard plane used herein means a plane expressed by $Z=Z_0$ where $Z_0$ is an average value of the height of the designated plane. The value of Rms is one of the representative measured values obtained by the ordinary AFM observation.

A specific regularity of {110} orientation is observed by an electron diffraction pattern of the semiconductor thin film in the above constitutions, and which characteristics are, arbitrary diffraction spots of the electron diffraction patterns are substantially circular form, and a ratio (a/b) of a short diameter (a) to a long diameter (b) of the diffraction spot is from 1/1 (circular form) to 1/1.5.

A specific regularity of {110} orientation is observed by an electron diffraction pattern of the semiconductor thin film in the above constitutions, and which characteristics are, arbitrary diffraction spots of the electron diffraction pattern have concentric circular diffusion against a center of an electron beam irradiated area, and an angle formed by a tangent line drawn from the center of the electron beam irradiated area to the diffraction spots and a line drawn from the center of the electron beam irradiated area to a center of the diffraction spots is ±1.5° or less.

The sixth constitution of the present invention is described as follows:

in a process of manufacturing a thin film transistor on an insulating surface, a process of manufacturing a semiconductor device is characterized by comprising at least these steps of:

forming a first amorphous silicon film in contact with a substrate, flattening the first amorphous silicon film by polishing, heat treatment of the first amorphous silicon film to obtain a silicon oxide film, and forming a second amorphous silicon film on the silicon oxide film. The process may further comprise, after the step of forming the second amorphous silicon film, a step of crystallizing the second amorphous silicon film to obtain a crystallized silicon film, and a step of forming an insulating film covering the crystalline silicon film.

The seventh constitution of the present invention is described as follows:

in a process of manufacturing a thin film transistor on an insulating surface, a process of manufacturing a semiconductor device is characterized by comprising at least these steps of:

forming an insulating film on a substrate, flattening the insulating film by polishing, heat treatment of the insulating film, and forming an amorphous silicon film on the insulating film.

The eighth constitution of the present invention is described as follows:

in a process of manufacturing a thin film transistor on an insulating surface, a process of manufacturing a semiconductor device is characterized by comprising at least these steps of:

thermal oxidization a single crystal substrate to obtain an oxidized film, flattening the oxidized film by polishing, heat treatment of the oxidized film again, and forming an amorphous silicon film on the oxidized film.

In the above sixth to eighth constitutions, the method of manufacturing the semiconductor device is characterized by the step of flattening which is conducted by mechanical polishing.

In the above sixth to eighth constitutions, the method of manufacturing the semiconductor device is characterized by the step of flattening which is conducted by chemical mechanical polishing.

In the above sixth to eighth constitutions, the method of manufacturing the semiconductor device is characterized by the step of flattening which is conducted by electrolytic in-process dressing.

BRIEF DESCRIPTION OF THE DRAWINGS

FIGS. 14A to 14F are showing examples of electric apparatuses.

DETAILED DESCRIPTION OF THE PREFERRED EMBODIMENTS

The manufacturing process of the present invention is shown in FIGS. 2A to 2D and described in detail as follows.

Figure 2A:
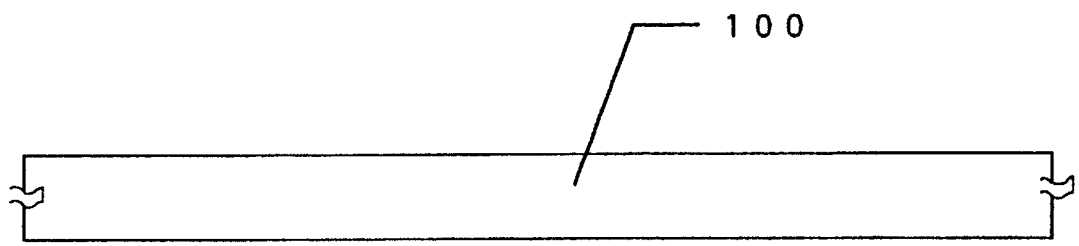
FIGS. 2A to 2D are showing the manufacturing process of the undercoat film of Example 1.
Figure 15A:
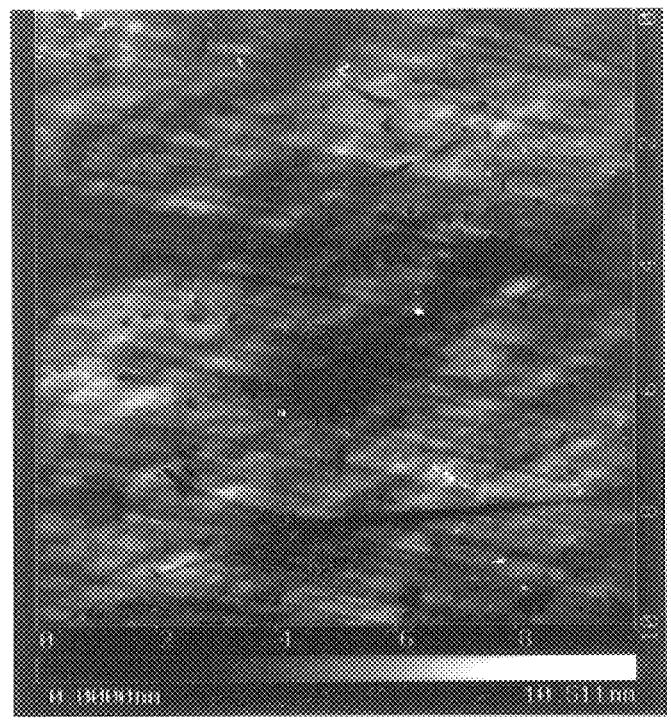
FIGS. 15A and 15B are photographs obtained by AFM observations.
Figure 15B:
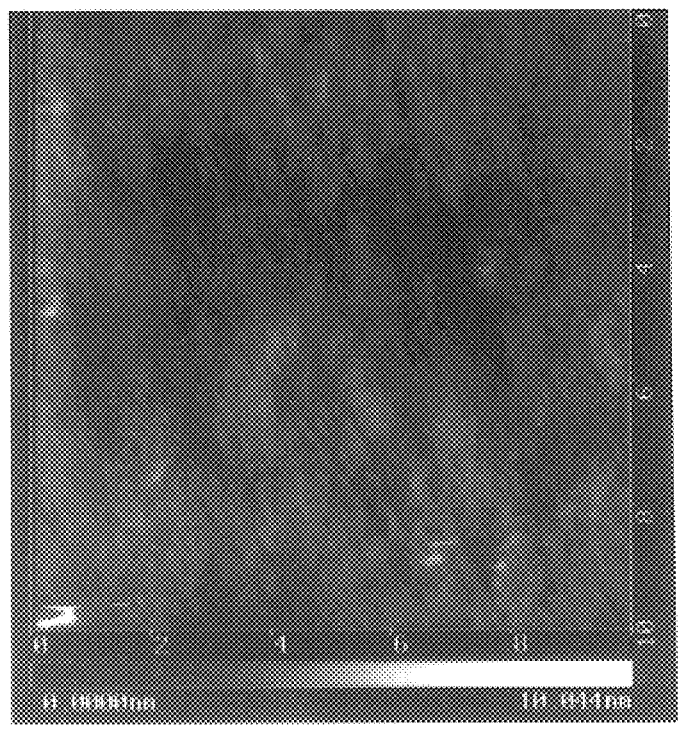

Low grade substrate which is marketed in low price is prepared (FIG. 2A). The quartz substrate 100 which is marketed in low price has holes (concave parts)largely caved in the surface. The holes are dispersed at random in a large number as shown in the AFM photograph of FIG. 15A.

Figure 2B:
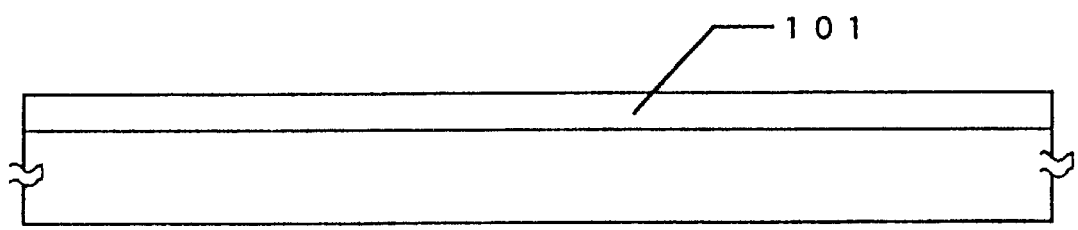
Figure 2C:
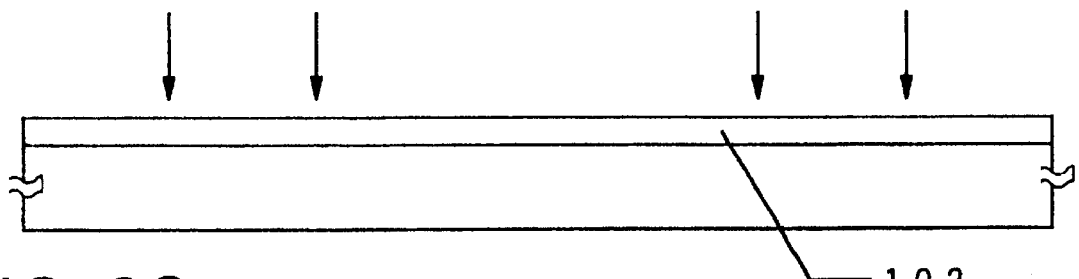

An undercoat film 101 comprising an amorphous silicon film is formed on the quartz substrate by a plasma CVD method or a low pressure CVD method to a thickness of from 50 to 300 nm, preferably 100 nm. (FIG. 2B).

A flattening treatment is then conducted on the undercoat film to obtain an undercoat film 102 having excellent flatness. Examples of the method of polishing the undercoat film include mechanical polishing, CMP, ELID, and ELID (electrolytic in-process dressing) which has a highly precise polishing process capable of flattening the film surface in an atomic size level, and is the most preferred to obtain the undercoat film having excellent flatness of the invention.

A heat treatment is then conducted to oxidize the undercoat film 102 having flatness, so that the radius of curvature $R_1$ around the opening of the upper part of the concave part of the undercoat film is made larger than the radius of curvature $R_2$ around the opening of the upper part of the concave part of the substrate, and the undercoat film is densified to reduce the defects and obtain an undercoat film (silicon oxide film) 103 having an inert surface with less unpaired bonds. The undercoat film 103 is an insulating film.

In the flattening step and the heat treating step, it is the most preferred to obtain a flat undercoat film (silicon oxide film) 103 having no concave part, but due to the influence of the holes on the substrate, concave parts are present on the undercoat film, which have a smaller depth than the holes on the substrate and a small opening. The surface of the undercoat film of the present invention does not have the Rms value and the shape of the concave part (average value of the depth, width and gradient of steeply inclined side walls and so) of the surface of the substrate, but has the following characteristics.

Figure 1A:
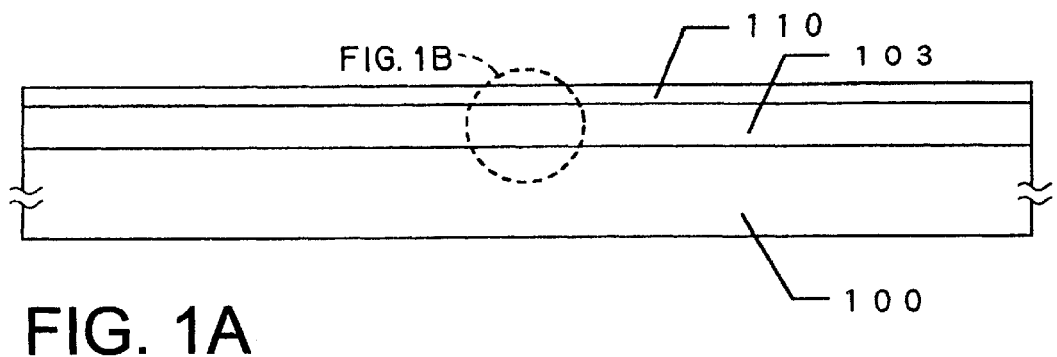
FIG. 1 is an enlarged cross sectional view of the vicinity of the undercoat film of the invention.
Figure 1B:
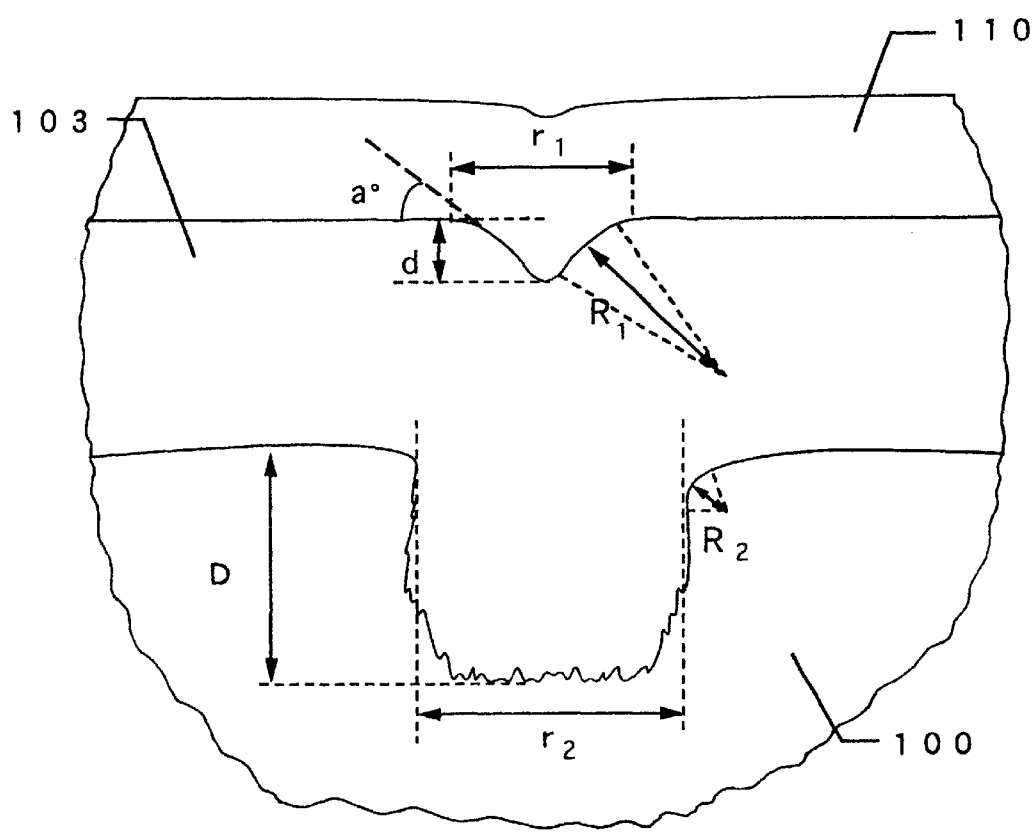

As shown in FIG. 1, the undercoat film of the present invention has such a surface that an average value of the depth of the concave part of the undercoat film d and an average value of a depth of the concave part of the substrate D satisfy d/D<1. When the value of d becomes the same as the value of D or becomes larger than the value of D, the covering property of the semiconductor thin film formed on the concave parts is deteriorated, and thus the crystal growth on the crystallization step is inhibited or solids (silicides) are formed. Since the thickness of the active layer of a TFT is about from ten to several hundreds nanometer, the average value of the depth of the concave part d is generally 10 nm or less, preferably 5 nm or less, more preferably 3 nm or less.

The opening diameter $r_1$ of the concave part present on the surface of the undercoat film (silicon oxide film) 103 of the present invention which is generally from 10 nm to 1 μm. When the opening diameter $r_1$ is too large, the covering property of the semiconductor thin film formed on the concave parts is deteriorated as similar to the case of the value of d. According to the experiences of the inventors, the covering property of the semiconductor thin film is not deteriorated when the opening diameter $r_1$ is smaller than the opening diameter $r_2$ of the upper part of the concave part of the substrate and is 1 μm or less, preferably 10 nm or less.

An angle a° formed by a tangent line at the cross sectional curve of the opening of the upper part of the concave part of the surface of the undercoat film (silicon oxide film) 103 and the surface plane is from 0° to 60°. Since the gradient of the cross sectional curve of the opening at the upper part of the concave part on the substrate is large, the gradient is relaxed by the undercoat film. Since the semiconductor thin film has a thickness of about from 10 to 100 nm, from the point of the step coverage, the angle a° formed by a tangent line at the cross sectional curve around the opening of the upper part of the concave part of the surface of the undercoat film and the surface plane is preferably from 0° to 30°. The value a° can be easily obtained from the cross sectional curve of AFM.

The radius of curvature $R_1$ around the opening of the upper part of the concave part of the surface of the undercoat film of the present invention is larger than the radius of curvature $R_2$ around the opening of the upper part of the concave part of the surface of substrate. As shown in FIG. 1, the upper part of the concave part of the substrate has a sharp point, at which crystal growth on the crystallization step is inhibited and solids (silicides) are liable to be formed. While the thickness of the semiconductor thin film is about from 10 to 100 nm, the radius of curvature $R_1$ at the opening of the upper part of the concave part of the surface of the undercoat film is preferably larger than the thickness of the semiconductor thin film, and more preferably larger than 50 nm.

The insulating film in contact with the bottom of the semiconductor thin film has a surface having a square root of mean square of surface roughness Rms of 0.3 nm or less. The square root of means square of surface roughness Rms is made 0.3 nm or less, particularly from 0.2 to 0.3 nm, by the flattening step. More preferably Rms is 0.15 nm or less. These values are those measured by AFM.

The shape of the concave part on the surface of the undercoat film 103 (average value of depth d, opening diameter $r_1$, angle a° formed by a tangent line at the cross sectional curve of the opening and the surface plane, and radius of curvature around the opening $R_1$) is controlled as described above. Thus, a semiconductor thin film without formation of silicides, cutout of the film and deterioration of coverage can be formed on the undercoat film.

The inventors have found that when the shape of the concave part of the undercoat film 103 is in the range described above, silicon cutout does not occur. Moreover, the density of the concave parts of the undercoat film becomes 100 per square centimeter or less, preferably 10 per square centimeter or less. Thus, crystal growth of the semiconductor thin film by the crystallization step is not inhibited.

In order to obtain the undercoat film 103 having the concave parts within the above range, the following procedures are conducted in the flattening step: The sharp points having a small radius of curvature around the opening of the upper part of the concave part of the undercoat film are shaved; the thickness of the undercoat film is increased by the thermal oxidation treatment; the radius of curvature around the opening at the upper part of the concave part of the undercoat film $R_1$ is made large; and the undercoat film is densified to reduce defects.

The semiconductor thin film 110 formed on the thus resulting insulating film with a good quality (undercoat film 103) has a surface which is excellent in flatness and a reduced silicon cutout, and crystal growth of the semiconductor thin film by the crystallization step is not inhibited.

Furthermore, by using the excellent semiconductor thin film, the uniformity of the TFT characteristics, the reliability and the yield of the semiconductor device can be improved.

The invention is further described by referring to the following examples, but the invention is not construed as being limited thereto.

EXAMPLE 1

In this Example, an example of the manufacturing process until the formation of the undercoat film 103 is described in detail by referring to FIGS. 2A to 2D.

A quartz substrate 100 which is marketed is prepared (FIG. 2A). The substrate 100 which is marketed has many holes caved in the surface. According to the AFM observations(FIG. 15A), the Rms of the quartz substrate is about from 1 to 1.5 nm, but the depth D is as large as from 30 to 60 nm, and it is found that there are holes caved at a steep angle. The quartz substrate is used in this Example, but the substrate is not limited to it and a ceramic substrate can also be used.

Then, an undercoat film 101 comprising an amorphous silicon film is formed by a plasma CVD method or a low pressure CVD method to a thickness of from 50 to 300 nm, preferably 100 nm. (FIG. 2B). The undercoat film may form by comprising a laminate of different films. Instead of the amorphous silicon film, an amorphous semiconductor thin film containing silicon such as $Si_xGe_{1-x}$ (0<x<1) may be used.

A flattening treatment is then conducted on the undercoat film 101 having concave parts to obtain an undercoat film 102 having excellent flatness. (FIG. 2C) The flattening treatment is conducted by ELID (electrolytic in-process dressing). Compared with the other polishing processes, the ELID polishing process can flatten accurately. However, the flattening step in this example is conducted by the ELID polishing process, mechanical polishing and CMP polishing and so can also be used instead of the ELID.

In the above flattening step, it is the most preferred to obtain a flat undercoat film having no concave part which influences the crystallinity of the semiconductor thin film, but in this example, due to the influence of the concave parts on the substrate, they are present on the undercoat film, which have a smaller depth than the holes on the substrate and a small opening.

A thermal oxidation step is then conducted by using an acidic gas atmosphere to which added HCl as a gas containing a halogen element.

However the thermal oxidation in this example is conducted by using an acidic gas atmosphere to which added HCl, one or plural kinds of gases selected from HF, HBr, $Cl_2$, $F_2$ and $Br_2$ can be used instead of HCl. These gases are preferably added to the acidic gas atmosphere in a content (volume content) of from 0.25 to 5% for HF, from 1 to 15% for HBr, from 0.25 to 5% for $Cl_2$, from 0.125 to 2.5% for $F_2$, and 0.5 to 10% for $Br_2$.

Figure 2D:
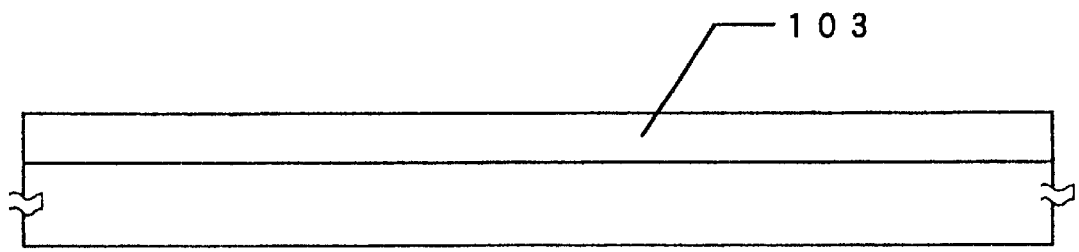

After the heat annealing step in the halogen atmosphere, the undercoat film is oxidized and densified to obtain an undercoat film 103 having a surface which defects are reduced and have good quality. The thickness of the amorphous silicon film become double by the thermal oxidation. (FIG. 2D).

Throughout the steps described above, the undercoat film 103 shown in FIG. 1 is obtained. It can obtain a surface of the undercoat film having a density of the concave parts of 100 per square centimeter or less, preferably 10 per square centimeter, and ideally 0 per square centimeter.

The shape of the concave part and the surface roughness of the undercoat layer 103 formed in the Example are shown as follows.

(1) Such a surface can be obtained that the average value of the depth of the concave part of the surface of the undercoat film (insulating film) d and the average value of the depth of the concave part of the surface of the substrate D satisfy d/D<1, and the average value of the depth of the concave part d is 10 nm or less, preferably 50Å or less, more preferably 3 nm or less.

(2) Such a surface can be obtained that the opening diameter of the upper part of the concave part of the surface of the undercoat film $r_1$ is from 10 nm to 1 μm, and the opening diameter $r_1$ is smaller than the opening diameter of the upper part of the concave part of the substrate $r_2$, and is preferably 1 μm or less, more preferably 10 nm or less.

(3) Such a surface can be obtained that the angle a° formed by the tangent line at the cross sectional curve of the opening of the upper part of the concave part of the surface of the undercoat film and the surface plane is from 0° to 60°. The angle a° is preferably from 0° to 30°.

(4) Such a surface can be obtained that the radius of curvature around the opening of the upper part of the concave part of the surface of the undercoat film $R_1$ is larger than the radius of curvature around the opening of the upper part of the concave part of the surface of the substrate $R_2$, and more preferably 50 nm or more.

(5) Such a surface can be obtained that the square root of mean square of surface roughness Rms of the insulating film in contact with the bottom of the semiconductor thin film is 0.3 nm or less. By the flattening step, such a surface can be obtained that the square root of mean square of surface roughness Rms is 0.3 nm or less, more preferably 0.15 nm or less.

By obtaining the undercoat film having the shape of the concave parts described above, silicon cutout does not occur, and even if a large concave part is present in the substrate, the shape of the concave parts which do not inhibit crystal growth on the crystallization step are obtained.

EXAMPLE 2

In this Example, manufacturing steps until the formation of the undercoat film having excellent flatness is described in detail by referring to FIGS. 3A to 3D.

Figure 3A:
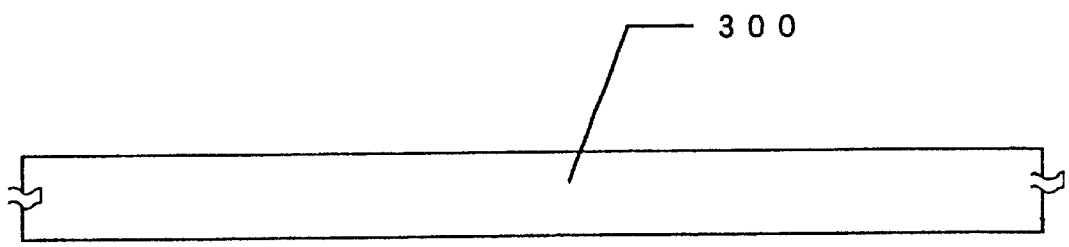
FIGS. 3A to 3D are showing the manufacturing process of the undercoat film of Example 2.

A low grade quartz substrate 300 which is marketed in low price is prepared (FIG. 3A). However it is not shown in FIG. 3A, the substrate 300 which is marketed has many holes caved in the surface. The quartz substrate is used in this Example, but the substrate is not limited to it and a ceramic substrate can also be used.

Figure 3B:
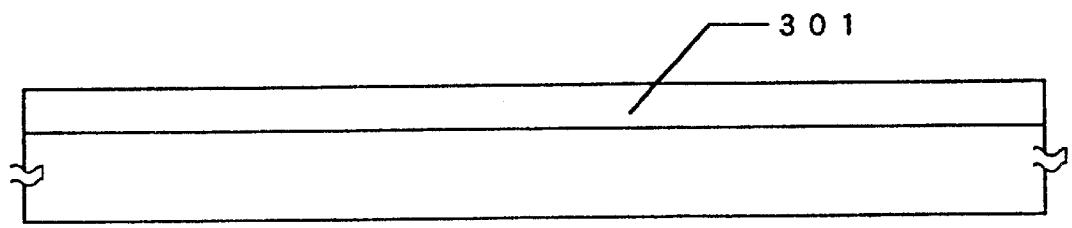

A silicon oxide film 301 is then formed by a plasma CVD method or by low pressure CVD method to a thickness of from 50 to 300 nm, preferably 100 nm. (FIG. 3B). This film may form by comprising a laminate of different films.

Figure 3C:
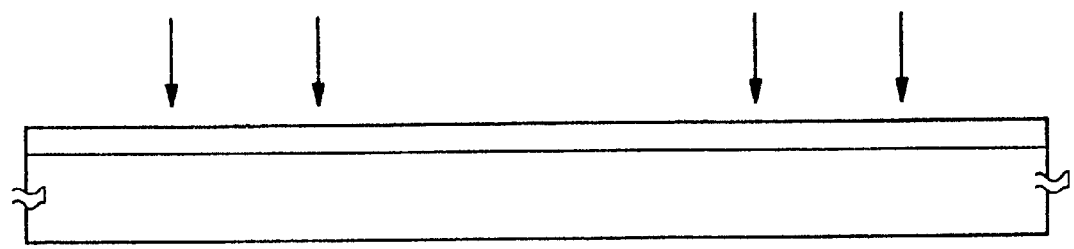

The silicon oxide film 301 having concave parts is then conducted flattening treatment (FIG. 3C).

The flattening treatment is conducted by CMP. In a representative process of the CMP (chemical mechanical polishing), the substrate is set on a rotating polishing head in such a manner that the surface to be polished faces downward. The polishing is conducted by pressing the substrate against a rotating platen (polishing platen). A pad is attached on the plane of which is in contact with the substrate, and the polishing is conducted with a slurry (polishing liquid) attached to the pad. The CMP polishing is used in this Example to flatten, but mechanical polishing and ELID polishing can also be used.

Figure 3D:
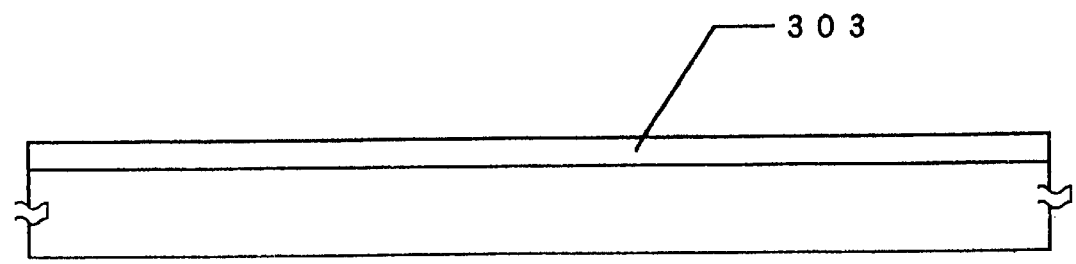

After heat annealing, the undercoat film is oxidized and densified to reduce defects and obtain an undercoat oxide film 303 having excellent flatness. (FIG. 3D). Thus, an undercoat film having the concave parts with the same shape and density as in Example 1 is obtained.

EXAMPLE 3

Figure 4A:
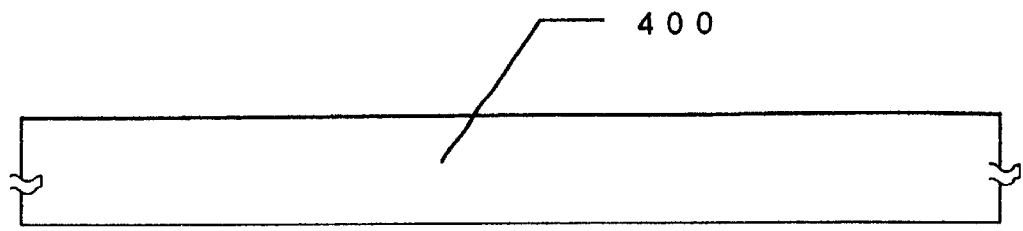
FIGS. 4A to 4D are showing the manufacturing process of the undercoat film of Example 3.
Figure 4B:
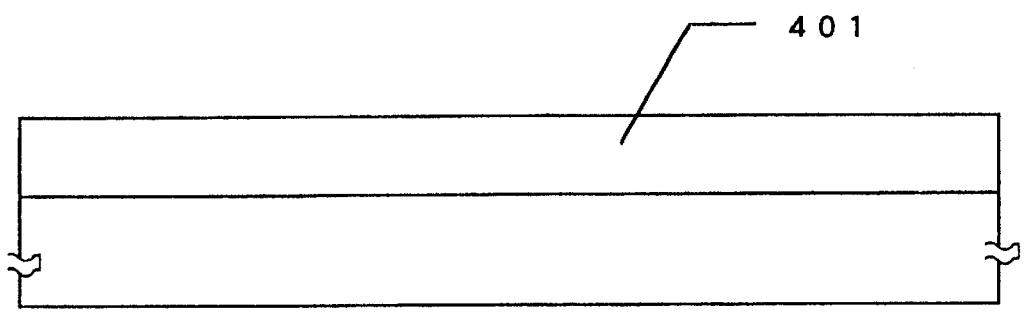

A single crystal silicon substrate 400 is prepared (FIG. 4A). In order to form an undercoat insulating film, thermal oxidation is conducted to form a silicon oxide film 401 having a thickness of from 50 to 300 nm, preferably 100 nm(FIG. 4B).

Figure 4C:
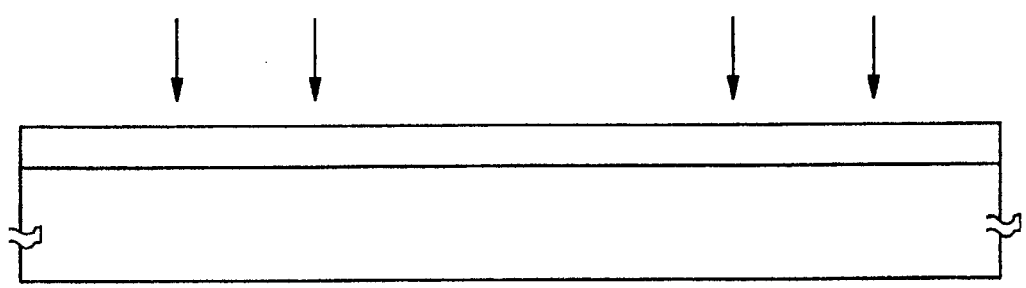

A flattening treatment is then conducted on the silicon oxide film. (FIG. 4C).

The flattening treatment is conducted by mechanical polishing. About the mechanical polishing, it is one of the well known polishing processes, which is conducted mechanically by using a polishing agent. The mechanical polishing is used in this Example, but CMP polishing and ELID polishing can also be used instead of mechanical polishing.

Figure 4D:
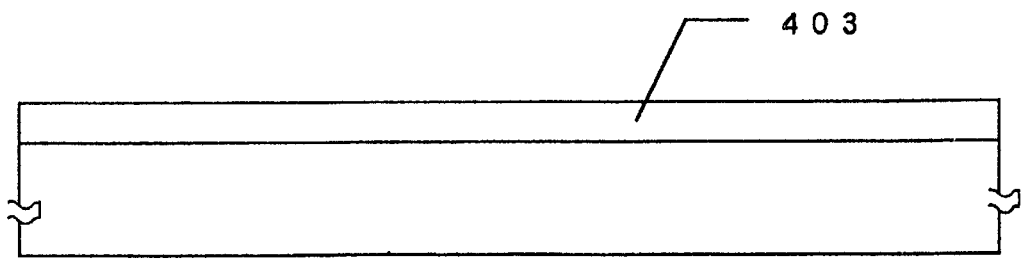
Figure 5:
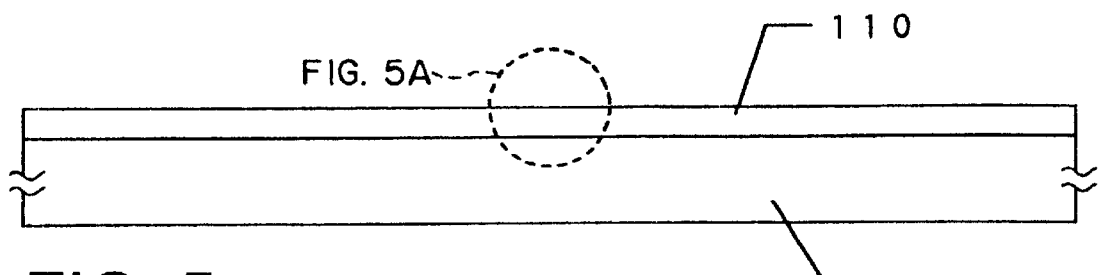
FIGS. 5, 5A and 5B are enlarged cross sectional views of a defect of a semiconductor device.
Figure 5A:
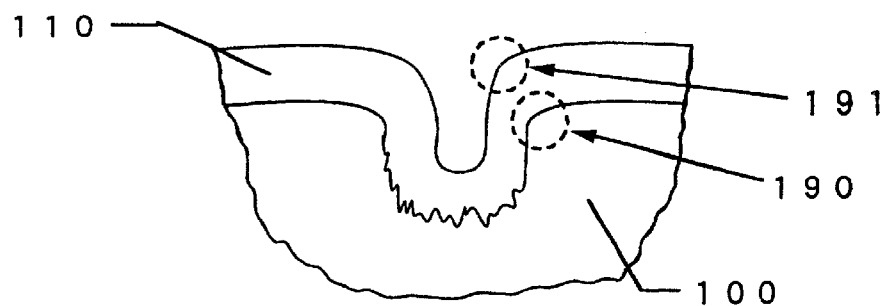
Figure 5B:
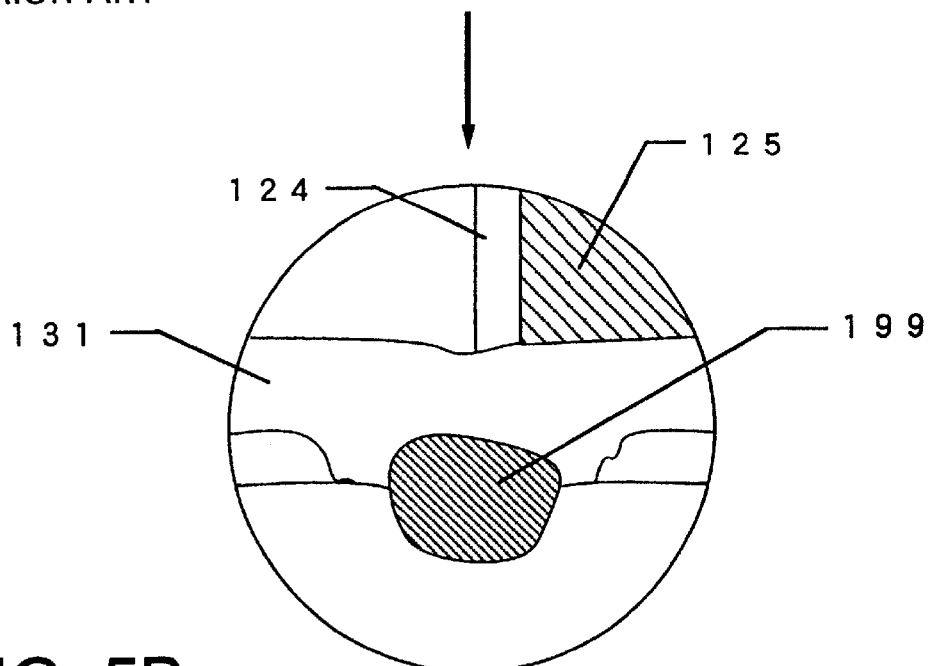

After heat annealing, the undercoat film oxidize and densify to reduce defects and it obtain an undercoat oxide film 403 having excellent flatness (FIG. 4D). Thus, an undercoat film having the concave parts with the same shape and density as in Example 1 is obtained.

EXAMPLE 4

In this Example, a manufacturing process of a semiconductor device (concretely a TFT) formed on the undercoat film, and a knowledge of the semiconductor thin film formed on the undercoat film is described by referring to FIGS. 1, 6A to 6D, 7A to 7D, 16A, 16B, 17A, 17B, 18A to 18C, 19A to 19C, 20 21A, 21B and 22A to 22C.

In this example, semiconductor device is manufactured by using undercoat film having an excellent flatten insulating surface which is formed according to above each example. The excellent flatness of the undercoat film exhibits an important role on manufacturing the semiconductor thin film of the present invention.

(Manufacturing Process of TFT)

An undercoat film is formed on an insulating substrate according to Example 1 or 3. The undercoat film formed by the process of Example 1 or 3 is excellent in flatness and has characteristics not inhibiting the subsequent crystal growth. In this Example, an undercoat film 103 is formed according to Example 1.

An amorphous silicon film 110 is formed on the undercoat film 103 as shown in FIG. 1. The amorphous silicon film 110 is controlled to have a final thickness (thickness considering the thinning after thermal oxidation) of from 10 to 75 nm (preferably from 15 to 45 nm). The film formation in this example is conducted by a low pressure thermal CVD method in accordance wit the following conditions.

Film forming temperature: 465° C.
Film forming pressure: 0.5 torr
Film forming gas: He (helium) 300 sccm $Si_2H_6$ (disilane) 250 sccm It is important to carefully control the impurity concentration of the film upon the formation of the film. In the case of this Example, in the amorphous silicon film 110, the concentrations of C (carbon) and N (nitrogen), which are impurities inhibiting crystallization, are controlled to less than $5\times10^{18}$ atoms/cm$^3$ (typically $5\times10^{17}$ atoms/cm$^3$ or less, preferably $2\times10^{17}$ atoms/cm$^3$ or less), and the concentration of O (oxygen) is controlled to less than $1.5\times10^{19}$ atoms/cm$^3$ (typically $1\times10^{18}$ atoms/cm$^3$ or less, preferably $5\times10^{17}$ atoms/cm$^3$ or less). This is because when the impurities are present in concentrations larger than the above, they adversely affect on the subsequent crystallization to become factors of deterioration of the film quality after crystallization.

Figure 20:
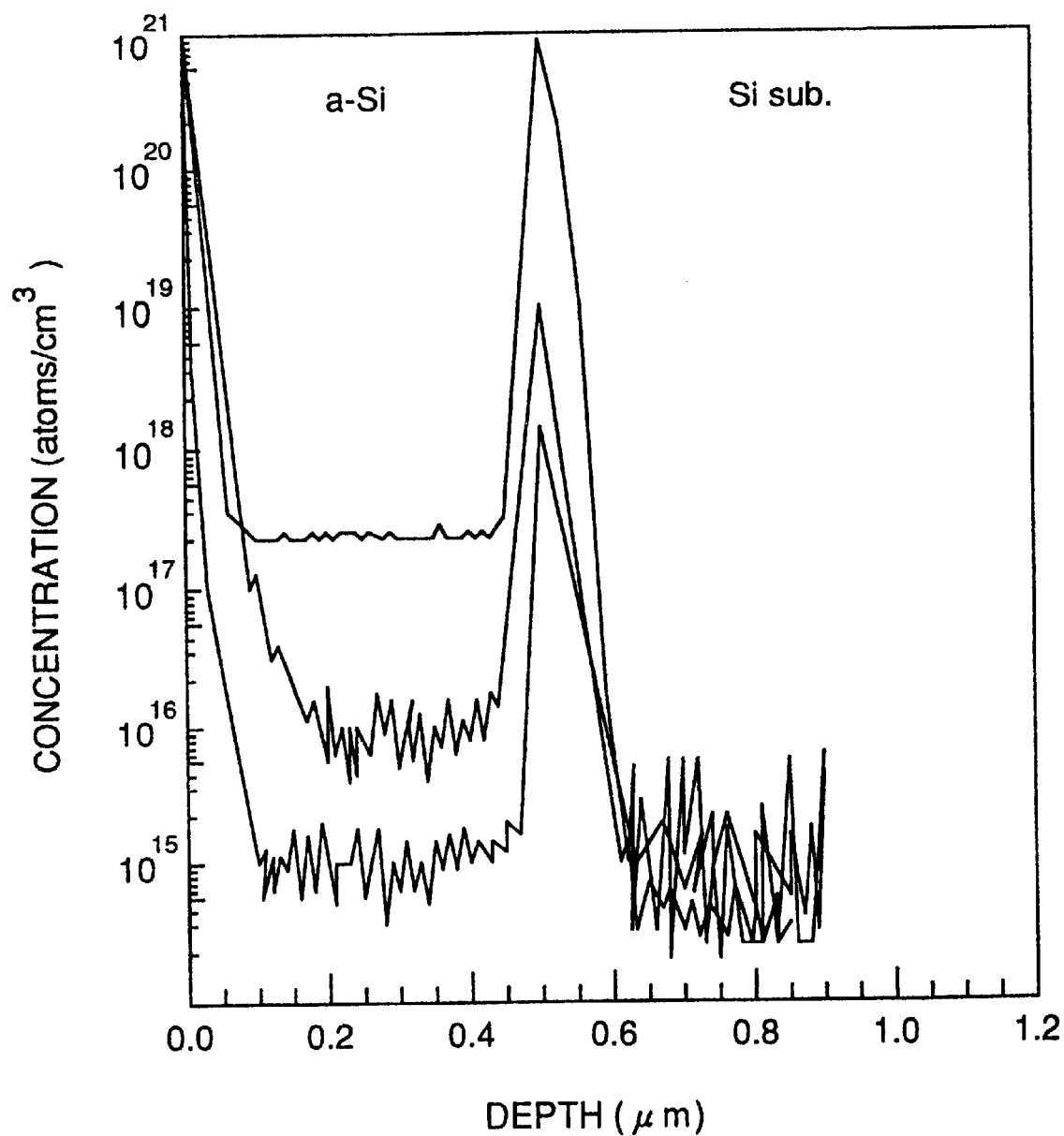
FIG. 20 is a graph showing the result of SIMS measurements.

Results of SIMS (secondary ion mass spectroscopy) analysis of the impurity concentrations in the amorphous silicon film formed under the conditions of this Example are shown in FIG. 20. As a sample, an amorphous silicon film having a thickness of 0.5 μm formed on a silicon wafer is used. As a result, it is confirmed that the concentrations of all C, N and O present within the above ranges. The impurity concentration in the present invention is defined by the minimum value of SIMS analysis result.

The hydrogen concentration of the amorphous silicon film 110 is also an important factor. It is considered that a film having good crystallinity can be obtained by suppressing the hydrogen concentration. The amorphous silicon film 110 is therefore preferably formed by the low pressure thermal CVD process. The plasma CVD method can also be utilized to suit the film forming conditions.

The step of crystallization of the amorphous silicon film 110 is then performed. As a method of crystallization, the technique described in Japanese Patent Laid-Open No. 7-130652 by the inventors is utilized. The entire disclosure this patent is incorporated herein by reference. However either the process in Example 1 or Example 2 of the publication may be utilized, it is preferred to utilize the technical contents in the present invention, which is described in Example 2 (detailed in Japanese Patent Laid-Open No. 8-78329, the disclosure of it being incorporated herein by reference).

Figure 6A:
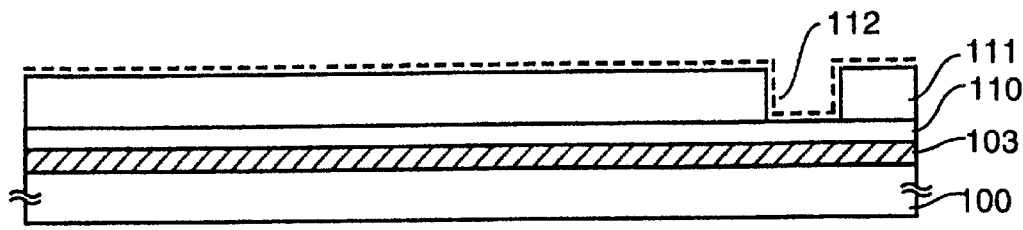
FIGS. 6A to 6D are showing a manufacturing process of a semiconductor device.

The technique described in Japanese Patent Laid-Open No. 8-78329 is that a mask insulating film 111 is formed to select the region to which a catalytic element is added. Then, a solution containing nickel (Ni) as a catalytic element accelerating the crystallization of the amorphous silicon film 110 is coated by a spin coating method to form an Ni-containing layer 112 (FIG. 6A).

As a catalytic element, cobalt (Co), iron (Fe), palladium (pd), platinum (Pt), copper (Cu), gold (Au), germanium (Ge), lead (Pb) and indium (In) can be used other than nickel.

As the addition step of the catalytic element, an ion injection method or a plasma doping method using a resist mask can also be used in addition to the spin coating method. In these cases, it is easy to decrease the occupation area of the addition region and to control the growing length of the growing region in the horizontal direction, and thus these technique is useful to produce a fine circuit.

After completing the addition step of the catalytic element and removal of hydrogen at 450° C. for about 1 hour, and crystallization of the amorphous silicon film 110 is performed by a heat treatment in an inert atmosphere, a hydrogen atmosphere or an oxygen atmosphere at a temperature of from 500° to 700° C. (typically from 550° to 650° C.) for from 4 to 24 hours. In this Example, a heat treatment is performed in a nitrogen atmosphere at 570° C. for 14 hours.

Figure 6B:
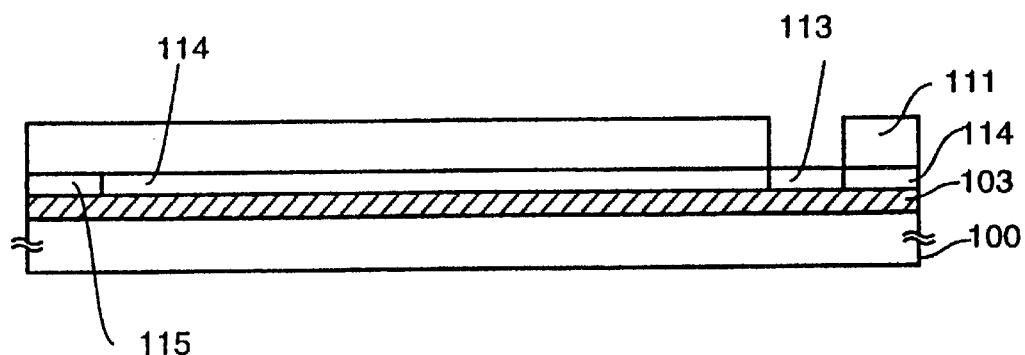

In this step, the crystallization of the amorphous silicon film 110 proceeds by priority at the region 113, to which nickel is added, and crystalline region is formed, which grows in a direction substantially parallel to the substrate surface of the substrate 100. The inventors call the crystalline region 114 a horizontal growth region. Since the horizontal growth region has crystals that are set in a relatively uniform state, it has an advantage of excellent crystallinity. (FIG. 6B).

After completing the heat treatment for crystallization, the mask insulating film 111 is removed, and patterning is performed to form a semiconductor layer (active layers) island 116 formed only in the horizontal growth region 114. A gate insulating film 117 composed of an insulating film containing silicon is provided. The thickness of the gate insulating film 117 may be controlled to a range of from 20 to 250 nm which is considered the increase after the thermal oxidation step. As the film formation process, conventional gas phase method (plasma CVD method and spattering method) may be used.

Figure 6C:
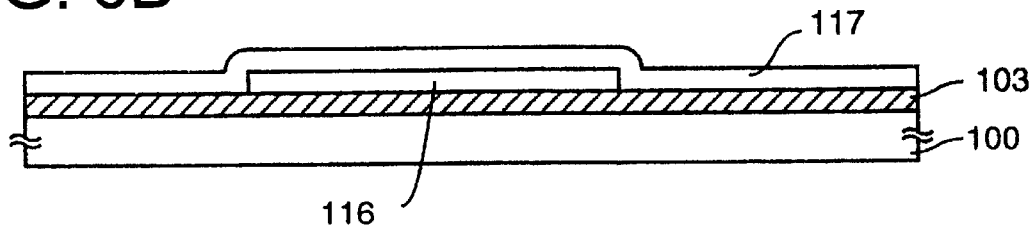

A heat treatment for removing or reducing the catalytic element (nickel) (gettering process of catalytic element) is then conducted as shown in FIG. 6C. This heat treatment is that a halogen element is contained to the treating atmosphere so as to utilize the gettering effect of metallic elements by the halogen element.

In order to obtain the sufficient gettering effect of the halogen element, the heat treatment is preferably performed at a temperature over 700° C. At temperatures below 700° C., it is difficult to decompose the halogen compound in the treating atmosphere, and the gettering effect may not be obtained. Thus the heat treatment is preferably performed at a temperature of from 800 to 1,000° C. (typically 950° C.), and the treating time is from 0.1 to 6 hours, typically from 0.5 to 1 hours.

As an typical example, the heat treatment is performed using an oxygen atmosphere containing from 0.5 to 10% by volume (3% by volume in the Example) of hydrogen chloride (HCl) at 950° C. for 30 minutes. When the HCl concentration is more than the above value, it is not preferred that unevenness which thickness is same to the film occurs on the surface of the active layer 116.

As a compound containing a halogen element, other than HCl gas, one or plural selected from halogen-containing compound like HF, NF$_3$, HBr, Cl$_2$, ClF$_3$, BCl$_3$, F$_2$, Br$_2$ and so may be used.

In this step, nickel in the active layer 116 is performed to gettering by the action of chlorine and become volatile nickel chloride which is then released and removed to the atmosphere. Thus, as to this step, the concentration of nickel in the active layer 116 is reduced to $5\times10^{17}$ atoms/cm$^3$ or lower (typically, $2\times10^{17}$ atoms/cm$^3$ or lower). In this case, according to the inventors' experiences, if the nickel concentration is $1\times10^{18}$ atoms/cm$^3$ or lower (preferably, $5\times10^{17}$ atoms/cm$^3$ or lower), the TFT characteristics are not influenced badly.

Further, the above-described gettering step is also effective to metal elements other than nickel. While as the metal elements to be contaminated into the silicon film, constituent elements of the film-forming chamber (typically, aluminum, iron, chromium, etc.) may be chiefly considered, if the above-described gettering step is performed, it is possible to reduce the concentrations of these metal elements to $5\times10^{17}$ atoms/cm$^3$ or lower (preferably, $2\times10^{17}$ atoms/cm$^3$ or lower).

After the above gettering step, nickel used for the gettering step remains in the active layer 116 in a concentration of from $1\times10^{15}$ to $1\times10^{20}$ atoms/cm$^3$. It is also confirmed by SIMS analysis that the halogen element is distributed in a high concentration between the active layer 116 and the thermal oxidation film formed by the heat treatment.

Furthermore, as a result of SIMS analysis for other elements, it was confirmed that the concentrations of the representative impurities, C (carbon), N (nitrogen), O (oxygen) and S (sulfur) are each $5 \times 10^{18}$ atoms/cm$^3$ or less.

Thermal oxidation proceeds at the interface between the active layer 116 and the gate insulating film 117 on the heat treatment to form a thermal oxidation film. By forming the thermal oxidation film according to these procedures, a semiconductor/insulation film interface with an extremely low interface state can be obtained. It also has an effect of preventing incomplete formation of the thermal oxidation film at the edge of the active layer (edge thinning). The thermal oxidation film is not shown in FIG. 6C.

Furthermore, it is effective to perform a heat treatment in a nitrogen atmosphere at 950° C. for about 1 hour to improve the film quality of the gate insulating film 117, after completing the heat treatment in a halogen atmosphere.

Figure 6D:
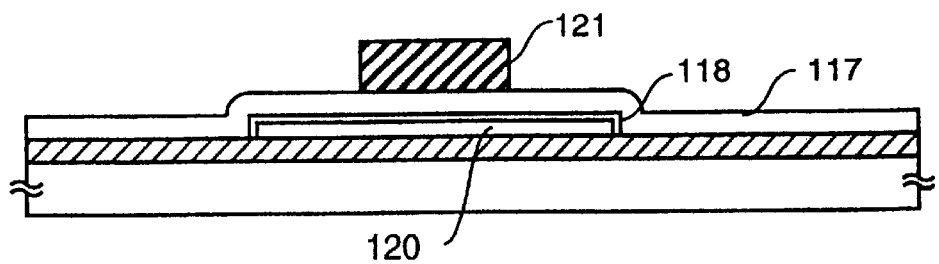

According to the above steps, a thermal oxidation film 118 is formed. After obtaining an active layer 120 (after gettering), a metallic film mainly composed of aluminum not shown in the Figures is formed and pattern to form a gate electrode 121. An aluminum film formed by using a target containing 2 wt % by weight of scandium is used in this example. A tantalum film and a silicon film having electro-conductivity may also be used. (FIG. 6D).

The technique described in Japanese Patent Laid-Open No. 7-135318 by this inventors is utilized. The entire disclosure of this patent is incorporated herein by reference. The publication discloses a technique which form a source/drain region and a low concentration impurity region with self-alignment by utilizing the oxidized film formed by anodic oxidation. The technique is described in brief as follows.

While the resist mask (not shown in Figure) used for patterning the aluminum film is remained, an anodic oxidation treatment is conducted in a 3% oxalic acid solution to form a porous anodic oxidized film 123. Since the thickness of the porous anodic oxidized film becomes the length of the low concentration impurity region, the thickness is controlled with taking it in consideration.

Figure 7A:
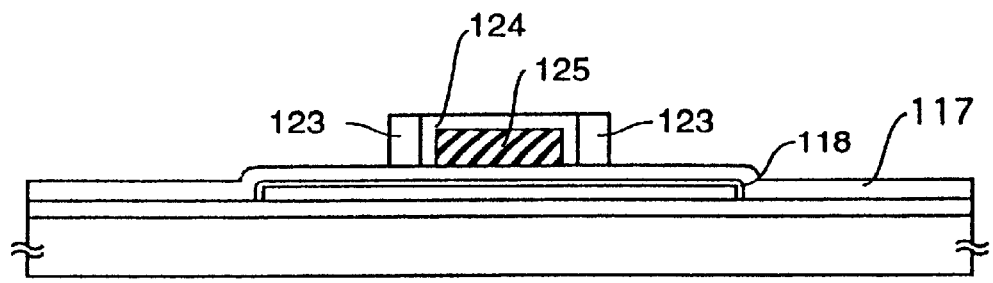
FIGS. 7A to 7D are showing a manufacturing process of a semiconductor device.

Then, after the resist mask (not shown in Figure) is removed, and an anodic oxidation treatment is performed in an electrolytic solution of an ethylene glycol solution mixed with 3% of tartaric acid. A dense non-porous anodic oxidized film 124 is formed by this treatment. The thickness of the film may be from 70 to 120 nm (FIG. 7A).

Figure 7B:
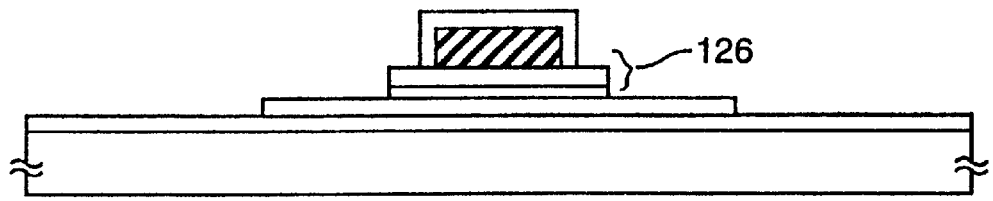

A gate insulating film 117 is etched by a dry etching method with the use of the gate electrode 125 and the porous anodic oxidized film 123 as a mask. The porous anodic oxidized film 123 is then removed. The edges of thus formed gate insulating film 117 are exposed corresponding to the thickness of the porous anodic oxidized film 123 (FIG. 7B).

An addition step of impurity elements endowing electro-conductivity is then performed. As the impurity elements, P (phosphorous) or As (arsenic) may be used for N-type and B (boron) or In (indium) may be used for P-type.

In this step, the first impurity addition is performed with a high acceleration voltage to form an n$^-$ region. Since the acceleration voltage is as high as about 80 keV, the impurity element is added not only to the exposed surface of the active layer but also to the lower part of the exposed edges of the gate insulating film. The second impurity addition is then performed with a low acceleration voltage to form an n$^+$ region. Since the acceleration voltage is as low as about 10 keV, the gate insulating film functions as a mask.

Figure 7C:
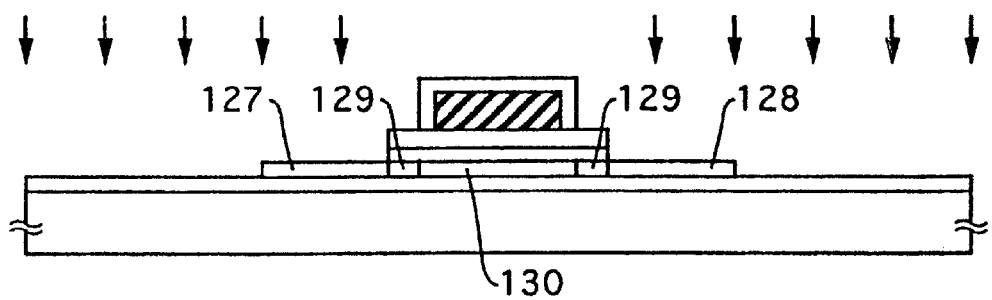

Formed by the above steps impurity regions, the n$^+$ region becomes a source region 127 and a drain region 128, and the n$^-$ region becomes a pair of low concentration impurity region 129 (sometimes called LDD regions). The impurity elements are not added to the region directly under the gate electrode, and it becomes an intrinsic or substantially intrinsic channel forming region 130 (FIG. 7C).

After completing the formation of the active layer as above, activation of the impurity elements is performed by the combination of furnace annealing, laser annealing and lamp annealing. At the same time, damage of the active layer suffered by the addition processes is restored.

An interlayer insulating film 131 is then formed to have a thickness of 500 nm. A silicon oxide film, a silicon nitride film, a silicon oxide nitride film, an organic resin film or a laminated film of them can be used as the interlayer insulating film 131.

Figure 7D:
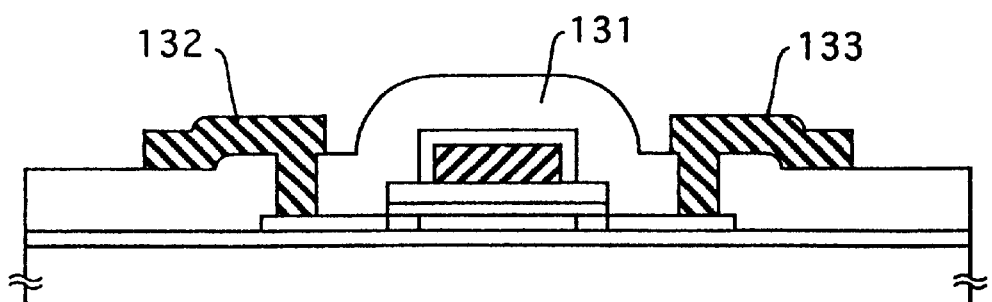

After forming contact holes, a source electrode 132 and a drain electrode 133 are formed. Finally, the whole substrate is heated in a hydrogen atmosphere at 350° C. for from 1 to 2 hours to hydrogenate the whole element, so that the dangling bonds (unpaired bonds) in the films (particularly in the active layers) are terminated. A TFT having the structure shown in FIG. 7D are produced by the above procedures.

The active layer 120 (after gettering) produced according to the manufacturing process of FIGS. 6A to 6D described in the above (manufacturing process of TFT) has, in a microscopic view, a crystalline structure in which plural stick like (or flattening stick like) crystals are regularly arranged in a particular direction where they are in substantially parallel to each other. This can be easily confirmed by the observation with TEM (transmission electron microscopy).

Figure 23A:
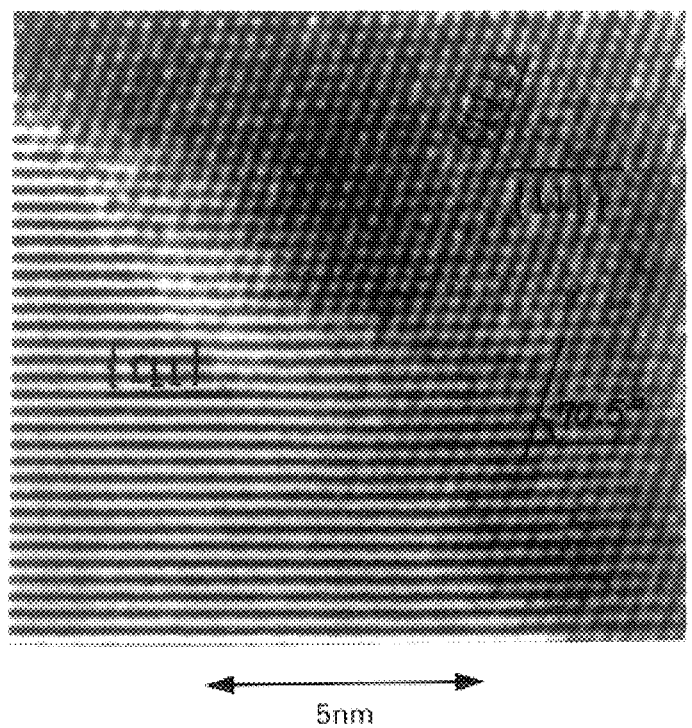
FIGS. 23A and 23B are TEM photographs showing crystal grains of the semiconductor thin film.
Figure 23B:
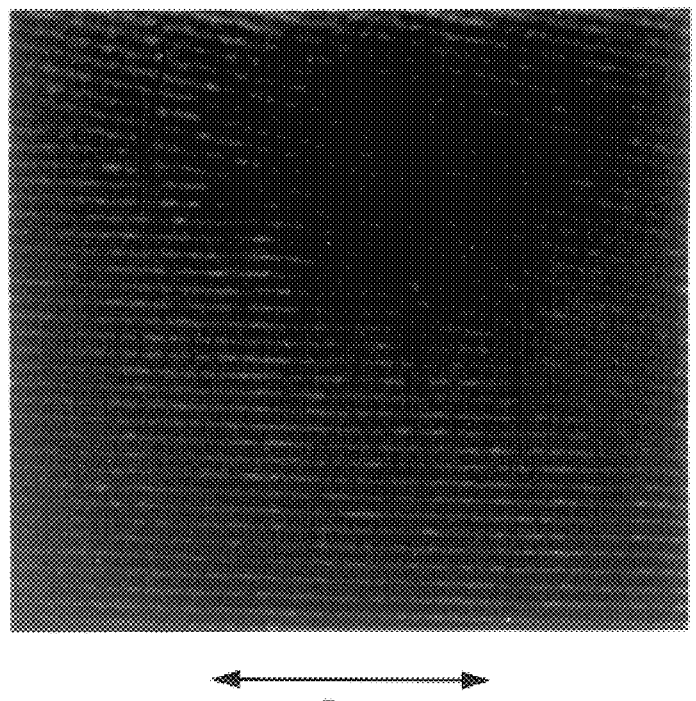

A HR-TEM photograph of the crystal grain boundaries of the stick like (or flattening stick like) crystals at a magnification of 8,000,000 times is shown in FIGS. 23A and 23B. The crystal grain boundary used herein means the grain boundary formed at the interface at which the stick like or flattening stick like crystals are in contact with each other. Therefore, it is considered that it is distinguished from macroscopic grain boundaries such as formed by colliding horizontal growth regions, for example.

The HR-TEM (high resolution transmission electron microscopy) is a method in which an electron beam is irradiated on a sample in the perpendicular direction, the arrangement of atoms and molecules is evaluated by using interference of transmitted electrons and elastically scattered electrons.

By using HR-TEM, the state of arrangement of the crystalline lattice can be observed as lattice stripes. Therefore, the bond state of atoms at the crystal grain boundaries can be expected by observing the crystal grain boundaries. However the lattice stripes appear as a stripe pattern of white and black, this is due to the difference in contrast but does not indicate the positions of the atoms.

FIG. 23A is a TEM photograph typically obtained from the crystalline silicon film in the invention, in which two different crystal grains are observed as they are in contact with each other at the grain boundary appearing from the upper left to the lower right of the photograph. The crystalline axis of the two crystal grains are in substantially {110} orientation though there was some deviation.

As a result of the observations for the plural crystal grains by X-ray diffraction or electron beam diffraction described later, it is confirmed that almost all the crystal grains are in substantially {110} orientation. However the (011) plane or the (200) plane are included in the many planes observed, these equivalent planes are expressed as {110} planes.

As shown in FIG. 23A, lattice stripes corresponding to the {111} plane and the {100} plane are observed. The lattice stripes corresponding to the {111} plane herein means when the crystal grain is cut along the lattice stripes, the {111} plane appears. Which lattice stripes correspond to which plane can be easily confirmed by the distance between the lattice stripes.

The reason why there is a difference in the appearance of the lattice stripes in FIG. 23A is the slight difference of the inclination of the crystal grains. When an electron beam is set to be perpendicularly to one side of the crystal plane of the crystal grain, it cause the state of the irradiation slightly oblique to the crystal grain, so that the appearance of the lattice stripes is changed.

Attention is directed to the lattice stripes corresponding to the {111} plane. In FIG. 23A, the lattice stripes corresponding to the {111} plane of the upper side of the crystal grain insert in the grain boundary intersect the lattice stripes corresponding to the {111} plane of the lower side of the crystal grain at an angle of about 70° (precisely 70.5°).

Such a crystalline structure (more correctly structure of crystal grain boundary) indicates that two different crystal grains are connected to each other at the crystal grain boundary with extremely high conformity. The crystal lattice continuously ranges at the crystal grain boundary to form a structure in that a trap level due to a crystal defect is very difficult to be produced. In other words, the crystal lattice has continuity at the crystal grain boundary.

A HR-TEM photograph of a conventional high temperature polysilicon film is shown in FIG. 23B. In FIG. 23B, there is no regularity of the crystal planes, and orientation mainly composed of the {110} plane is not observed as described later. A crystal grain that exhibits lattice stripes corresponding to the {111} plane is selected to comparison with FIG. 23A.

As a result of detailed observation of FIG. 23B, it can be found that there are many parts where the lattice stripes are interrupted as pointed by the arrow in the Figure. Unpaired bonds (which can be considered as crystal defects) are present in such parts, and there is high possibility that they prevent migration of carriers as a trap level.

There are unpaired bonds such as shown in FIG. 23B in the crystalline silicon film of the present invention. However, as a result of TEM observations of the polycrystalline silicon film of the present invention throughout its wide area, it becomes clear that the amount of such unpaired bonds is extremely small.

As a result of the observation of the inventor, the continuity of the crystal grain boundaries is found in 90% or more (typically 95% or more), and it is difficult to find the unpaired bond such as shown in FIG. 23B. It is considered from these facts that the crystalline silicon film of the invention is a semiconductor thin film largely different from the conventional high temperature polysilicon film.

Figure 16A:
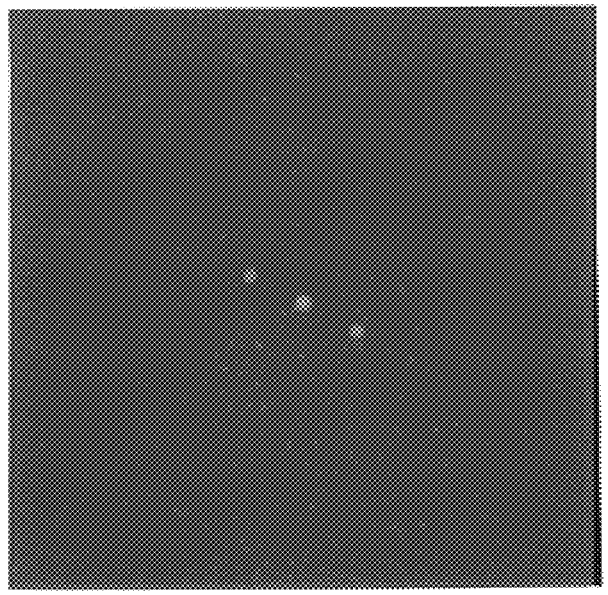
FIGS. 16A and 16B are photographs showing electron beam diffraction patterns of the semiconductor thin films.
Figure 16B:

A result obtained by electron beam diffraction of the semiconductor thin film of the invention is shown in FIG. 16A. An electron beam diffraction pattern of the conventional high temperature polysilicon film is shown in FIG. 16B for reference. In FIGS. 16A and 16B, the diameters of the electron beam irradiated area are 4.25 μm and 1.35 μm, respectively. In this Example, a representative photograph is shown among the results of the plural observations.

In FIG. 16A, diffraction spots corresponding to the <110> incidence are observed clearly relative, and it can be confirmed that substantially all crystal grains in the electron beam irradiated area are in the {110} orientation.

The inventors perform X-ray diffraction according to the method described in Japanese Patent Laid-Open No. 7-321339 (of which disclosure is incorporated herein by reference), and calculated the orientation ratio for the silicon thin film. In this published application, the orientation ratio is defined by the following equations.

{220} orientation existence ratio=1 (constant)

{111} orientation existence ratio=(relative intensity of {111} to {220} of specimen)/(relative intensity of {111} to {220} of powder)

{311} orientation existence ratio=(relative intensity of {311} to {220} of specimen)/(relative intensity of {311} to {220} of powder)

{220} orientation ratio=({220} orientation existence ratio)/[{220} orientation existence ratio)+{111} orientation existence ratio)+ {311} orientation existence ratio)]

As a result of observation of the orientation of the semiconductor thin film of the present invention with X-ray diffraction, a peak corresponding to the (220) plane appears in the X-ray diffraction pattern. The (220) plane is equivalent to the {110} plane. It is therefore found that the {110} plane is the major orientation plane and the orientation ratio is 0.7 or more (typically 0.9 or more).

In the case of the conventional high temperature polysilicon film shown in FIG. 16B, there is no clear regularity in the diffraction spots, which are distributed at random. In other words, it is found that crystal grains of plane azimuth other than the {110} plane are irregularly present as a mixture.

There is observed slight concentric circular expanse in the respective spots. It is considered that there is some distribution of rotation angles around the center of crystal axis. This is described as follows.

Figure 17A:
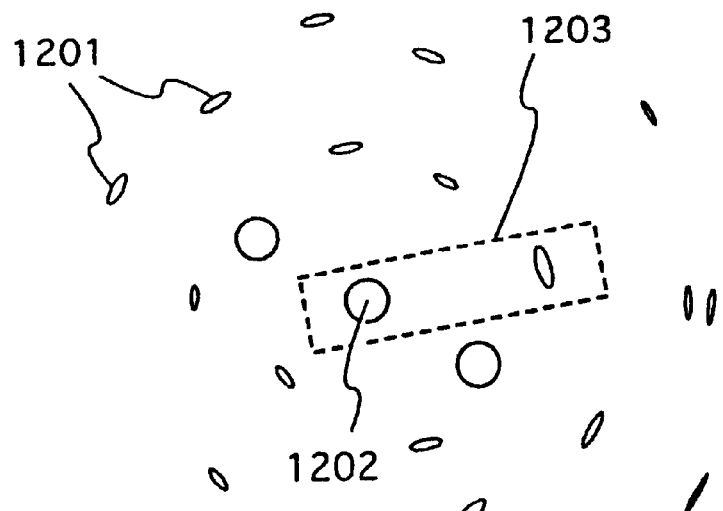
FIGS. 17A and 17B are schematic diagrams of an electron beam diffraction pattern.

One part of a schematic diagram of the electron beam diffraction pattern of FIG. 16A is shown in FIG. 17A. In FIG. 17A, plural luminous dots 1201 are diffraction spots corresponding to the <110> incidence. The plural diffraction spots 1201 are distributed in a concentric circular form with the center 1202 of the irradiated area as the center.

Figure 17B:
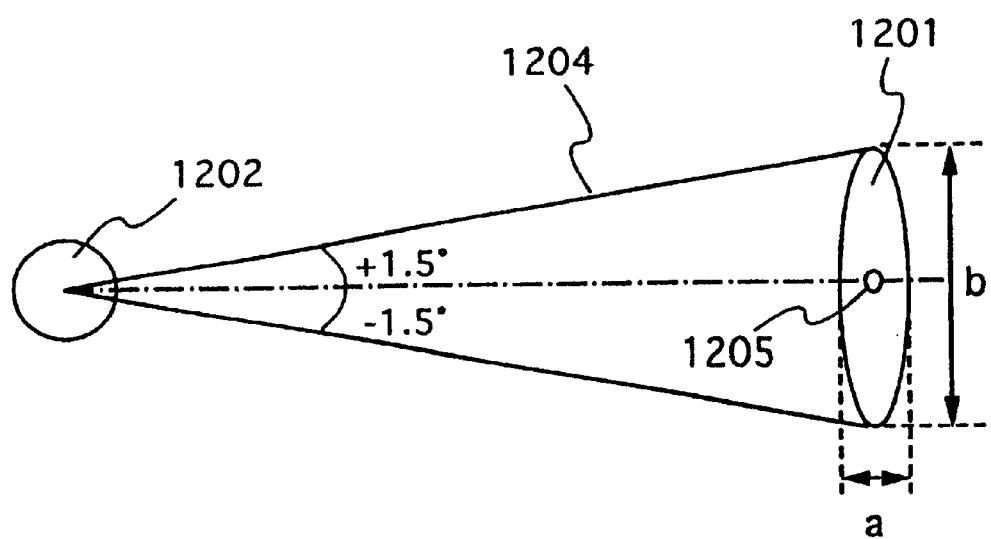

The region shown by broken lines 1203 in FIG. 17A is enlarged and shown in FIG. 17B. As shown in FIG. 17B, it is found from the detailed observation of the electron beam diffraction pattern shown in FIG. 16A that the diffraction spot 1201 has an expanse (fluctuation) of about ±1.5° with respect to the center 1202 of the irradiated area.

Accordingly, this means that the angle formed by the tangent line 1204 drawn from the center 1202 of the electron beam irradiated area to the diffraction spot 1201 and the line connecting the center of the electron beam irradiated area 1202 and the center 1205 of the diffraction spot is 1.5° or less (which angle corresponds to ½ of the rotation angle). Two tangent lines can be drawn in this case, and thus the expanse of the diffraction spot 1201 puts within the rang of ±1.5° or less.

Such a tendency is observed throughout the whole area of the electron beam diffraction pattern shown in FIG. 16A, and the expance totally put within the range of ±2.5° or less (typically ±1.5° or less, preferably ±0.5° or less). The above described words "there is observed slight concentric circular expanse in the respective spots" mean this phenomenon.

By making the undercoat film of the semiconductor thin film flat as possible, the ratio (a/b) of the short diameter a and the long diameter b of the diffraction spot 1201 can be from 1/1 (circular form) to 1/1.5. This means that the diffraction spot becomes circular or substantially circular.

In order to make the diffraction spot circular, the rotation angle present between plural crystal grains has to be extremely small. In view of the fact that the diffraction spot becomes completely circular in the electron beam diffraction pattern of a single crystal, the fact that the diffraction spot becomes circular means that the semiconductor thin film of the invention approaches as possible as a single crystal.

Figure 18A:
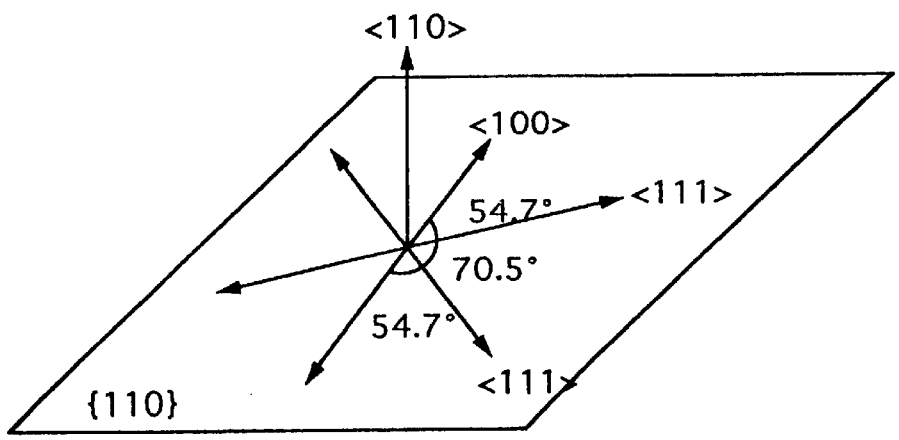
FIGS. 18A to 18C are schematic diagrams showing the relationship of azimuth of the semiconductor thin film.
Figure 18B:
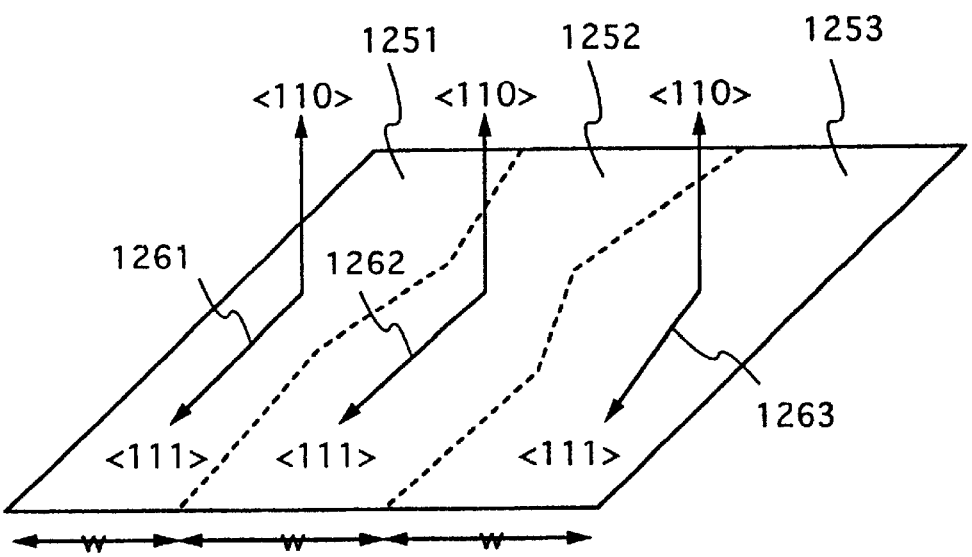
Figure 18C:
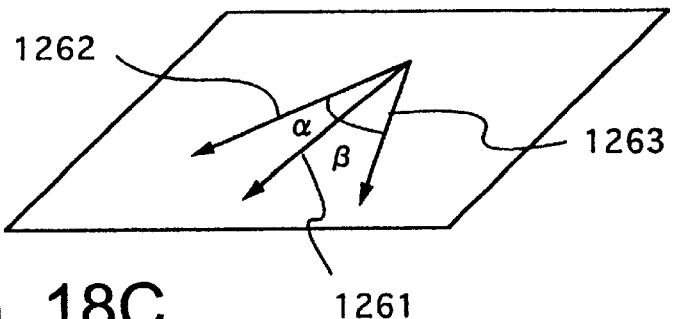

FIGS. 18A to 18C show schematic diagrams of the relationship between the plane azimuth of crystal grain and the crystal axes of crystals. FIG. 18A shows the relationship between the crystal axes in the case where the plane azimuth is {110} and the axes contained in the crystal planes. When the crystal plane is in {110} orientation, the crystal axis is the <110> axis, and the <111> axis and the <100> axis are contained in the crystal plane.

As a result of the observation for the growing direction of the above described stick like crystals with HR-TEM, it has been found that they grow substantially to the <111> axis direction (as described in Japanese Patent Laid-Open No. 7-321339). Therefore, when a part of the semiconductor thin film of the present invention is enlarged, it is considered that it is in the state shown in FIG. 18B.

In FIG. 18B, 1251, 1252 and 1253 are stick like crystals, and the crystal axes of which are substantially the <110> axes. Since the crystal growth proceeds substantially in the <111> direction in average, the direction of the stick like crystals substantially agrees with the <111> direction. The broken lines in FIG. 18B mean crystal grain boundaries.

When the <111> axis 1261 contained in an arbitrary crystal grain 1251 is taken as the standard axis, the <111> axes 1262 and 1263 contained in the stick like crystals 1252 and 1253 present in the vicinity of the crystal grain 1252 agree with the standard axis 1261 or slightly deviate from the standard axis 1261 to make certain angles. Such angles are called rotation angles herein.

The above described fact that the expanse of the diffraction spot falls within the range of ±2.5° or less (typically ±1.5° or less, preferably ±0.5° or less) has the same meaning as that the absolute value of the rotation angle put within the range of 5° or less (typically 3° or less, preferably 1° or less).

These relationships are summarized in FIG. 18C. In the semiconductor thin film of the present invention, the angle α formed by the axis 1262 and the standard axis 1261 and the angle β formed by the axis 1263 and the standard axis 1261 are rotation angles. Such rotation angles fall within the range of 5° or less.

And as shown in FIG. 18B, the crystal grains having slightly different rotation angles appear on the electron beam diffraction pattern as different diffraction spots. For example, the diffraction spots of the crystal grains 1252 and 1253 appear on concentric circles deviated from the diffraction spot of the crystal grain 1251 at the rotation angles α and β.

Accordingly, when plural crystal grains are present in the electron beam irradiated area, diffraction spots corresponding to the plural crystal grains in a concentric circular form, and the diffraction spots have shapes near an elliptic form in appearance. This is a reason why the diffraction spot of the electron beam diffraction pattern of FIG. 16A has expanse.

The expression <111>, for example, contains plural equivalent axes such a [111] and [1−11]. (The symbol minus means inversion.) Diffraction spots appear corresponding to all the equivalent axes, and as a result, the electron beam diffraction pattern of FIG. 16A is formed. When the crystal grain rotates at a rotation angle, the electron beam diffraction pattern also rotates at the rotation angle. Thus, all the diffraction spots have expanse in a concentric circular form.

As described above, the reason why the diffraction pattern of FIG. 16A is obtained as a result of the electron beam diffraction of the semiconductor thin film of the present invention is considered as the fact that plural stick like crystals are present in the electron beam irradiated area, and they have rotation angles slightly different from each other. It is considered from the expanse of the diffraction spots that the absolute value of the rotation angle is 5° or less (typically 3° or less, preferably 1° or less).

This means that the deviation of the standard axes put with the range of 5° or less even between the two crystal grains that have the largest rotation angles among all the crystal grains constituting the semiconductor thin film of the present invention.

The above described rotation around the crystal axis is "a rotation of the direction contained in the grain boundary", and therefore is involved in the small angle boundary. In case that such a crystal boundary is formed, the two crystal grains 1271 and 1272 are in contact with each other in a state shown in FIG. 19A as a schematic view, and have an axis 1273 as a rotation axis. In this case, the plane at which two crystal grains are in contact with each other is the grain boundary. In the semiconductor thin film of the invention, the rotation angle around the crystal axis is as extremely small as ±2.5° or less.

Figure 19A:
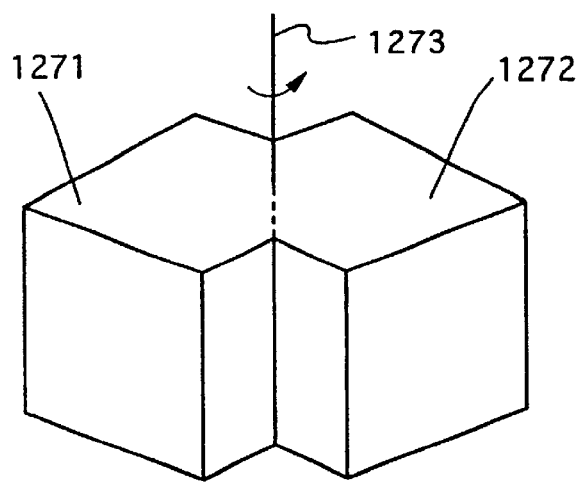
FIGS. 19A to 19C are schematic diagrams showing the shape of the crystal grain boundaries.
Figure 19B:
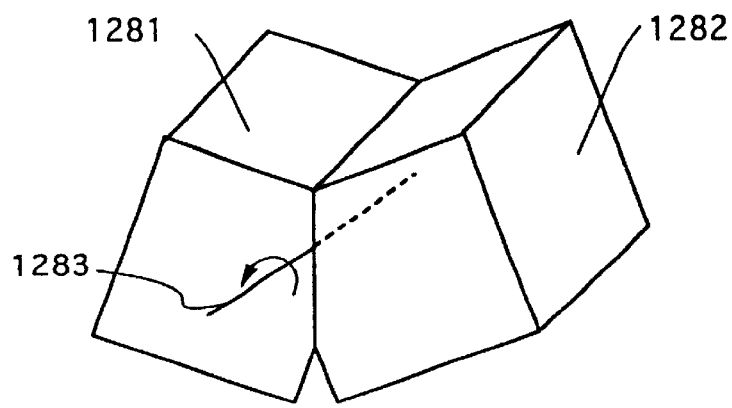

The small angle grain boundary also involves the state shown in FIG. 19B. In the state of FIG. 19B, the axis as the rotation axis 1273 is different from the case of FIG. 19A. However, this is the same as in FIG. 19A in the sense that the two crystal grains 1281 and 1282 form the rotation angle 1283 with the axis contained in the grain boundary as the center. In the semiconductor thin film of the present invention, the rotation angle in this case is also ±2.5° or less (typically ±1.5° or less, preferably ±0.5° or less), and therefore such crystal grain boundaries 1281 and 1282 can be considered as not present.

Figure 19C:
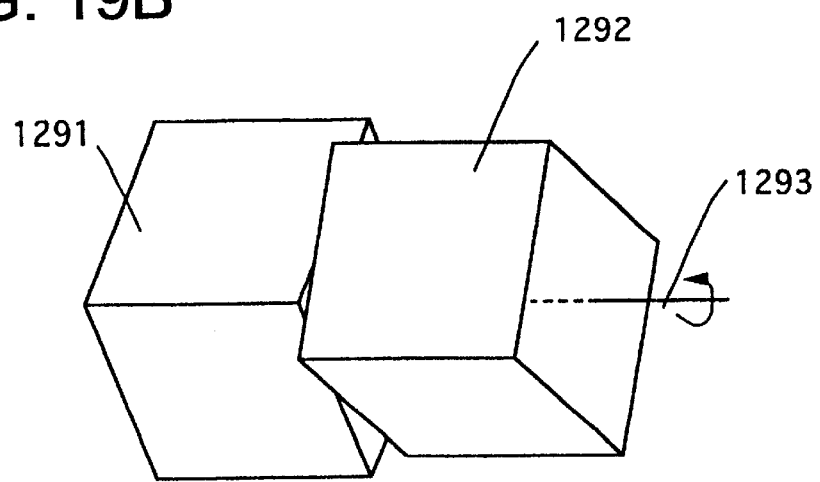

The small angle grain boundary also involves the twist grain boundary classified in low angle grain boundary, which is distinguished from the small angle boundaries shown in FIGS. 19A and 19B. The twist grain boundary is the case where the crystal rotates in a direction perpendicular to the grain boundary as shown in FIG. 19C.

This is the same as the small angle grain boundary in the sense that the two crystal grains 1291 and 1292 form the rotation angle 1293. In the semiconductor thin film of the present invention, the rotation angle in this case is also ±2.5° or less (typically ±1.5° or less, preferably ±0.5° or less), and therefore the twist grain boundary can be considered as not present.

As described in the foregoing, the semiconductor thin film of the present invention contains no or substantially no electrically active crystal grain boundary, which is generally called as a small angle boundary. The term "electrically active" used herein means that it can function as a trap for carriers.

The term "substantially no" used herein means that only one or two of the grain boundaries in question (small angle boundaries, for example) are found even when all the crystal grain boundaries of 5 μm square, for example, are observed.

However a twin boundary and other coincidence boundaries are involved in the special large angle boundary, it is confirmed that the semiconductor thin film of the present invention is almost the twin boundaries. The coincidence boundaries are electrically inactive (do not function as a trap for carriers) even if they are present.

Particularly, in the semiconductor thin film of the invention, the coincidence boundaries of Σ3 ({111} twin boundaries) occupy 90% or more (typically 95% or more), and it is proved that crystal grain boundaries of extremely good coordination are formed in a wide area.

The Σ value is a factor indicating the degree of alignment of the coincidence boundaries. The smaller the Σ value is, the better the alignment of the crystal grain boundary is. The definition of the Σ value is described in detail in "High-Resolution Electron Microscope for Evaluation of Materials" by Daisuke Shindo and Kenji Hiraga, pp. 54–60, published by Kyoritsu Shuppan Co., Ltd. on 1996.

In the crystal grain boundary formed between two crystal grains, when the plane azimuth of both crystal grains is {110}, it is known that the boundary becomes the coincidence boundary of Σ3 if θ is 70.5°, where θ is an angle formed by lattice stripes corresponding to the {111} plane.

Therefore, in the crystal grain boundary shown in the TEM photograph of FIG. 1A, the lattice stripes of the neighboring crystal grains continues at an angle of 70.5°, and thus it can easily estimated that the crystal grain boundary is the {111} twin boundary.

When θ is 38.9°, it becomes the coincidence boundary of Σ9. They are present in a small amount.

The coincidence boundaries are formed only between crystal grains having the same plane azimuth. Because the semiconductor thin film of the invention has the plane azimuth substantially uniformly arranged in {110}, such coincidence boundaries are formed in a wide area. This characteristic feature of the invention cannot be realized in the other polysilicon films where the plane azimuth is irregular.

The random large angle boundaries are found in a semiconductor thin film where crystal grains in irregular directions are arranged without any significant direction relationship. This is frequently found in a semiconductor thin film such as the conventional high temperature polysilicon film. In the semiconductor thin film of the invention, substantially no large angle boundaries are present.

In case that there is no small angle boundary and no random large angle boundary, or there is an extremely small number of them, it can be considered that there is not active crystal grain boundary. Therefore, a semiconductor thin film having such a crystalline structure can be considered as a single crystal having no crystal grain boundary or a substantially single crystal.

In the semiconductor thin film of the invention, crystal grains (stick like crystals) constituting the thin film each has azimuth relationship that completely agrees to each other, or has relationship where each grains forms certain rotation angles. The rotation angle is as extremely small as ±2.5° or less, which can be considered as a level that forms substantially no crystal grain boundary.

The inventors consider that the major reason why such a semiconductor thin film is obtained resides in the flatness of the undercoat film 103. According to the experiences of the inventors, when the undercoat has unevenness, it greatly affects on crystal growth. That is, the unevenness of the undercoat brings about distortion in crystal grains, which leads to deviation of crystal axes.

The semiconductor thin film 110 of the invention is formed on the undercoat film 103 having extremely high flatness, which is formed according to the process shown in this Example. The growth of the semiconductor thin film can proceed under the conditions where factors inhibiting the crystal growth are eliminated as possible, and therefore the crystal grains are coupled with maintaining extremely high crystallinity. It is considered, as a result, that the semiconductor thin film that can be considered as a single crystal is obtained.

In the production of the semiconductor thin film of the invention, the annealing step (the step as shown in FIG. 6B in the case of this example) at a temperature higher than the crystallization temperature (the heat treating temperature in the step of crystallization of silicon) exhibits an important role with respect to the reduction in defects in the crystal grains, which is then explained as follows.

Figure 21A:
FIGS. 21A and 21B are TEM photographs showing crystal grains of crystalline silicon.

FIG. 21A is a TEM photograph of the crystalline silicon film after the crystallization step shown in FIG. 4B at a magnification of 250,000. In the crystal grain (the black part and the white part appear due to the difference in contrast), defects pointed by the arrows are observed in a zigzag form.

The defects are mainly stacking faults where the stacking order of atoms deviates, but also include dislocation. It is considered that what appears in FIG. 21A is a stacking fault having a defect plane parallel to the {111} plane, which can be estimated from the defects in a zigzag form are folded at an angle of about 70°.

Figure 21B:
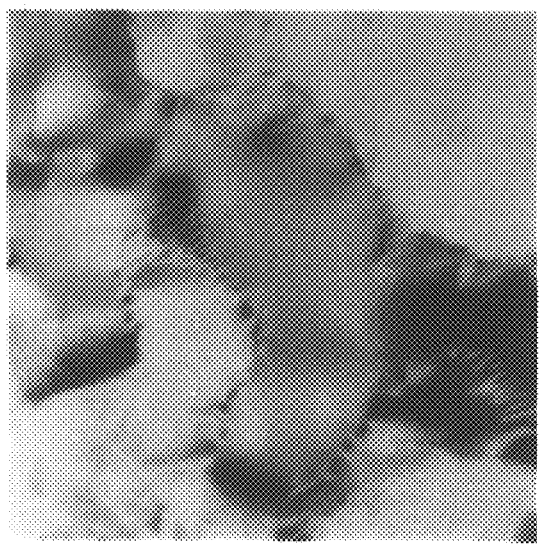

FIG. 21B is a TEM photograph at the same magnification of the crystalline silicon films of the invention. There is observed substantially no defect due to stacking faults or dislocation in the crystal grain, and it is confirmed to have very high crystallinity. The same tendency can be applied to the whole film. Although it is currently difficult to completely avoid any defect, it can be reduced to the level that there is substantially no defect.

Accordingly, the crystalline silicon film shown in FIG. 21B can be considered as a single crystal or a substantially single crystal because the defect in the crystal grains is reduced to the level of substantially none, and the crystal grain boundaries do not become a barrier of carrier migration owing to the high continuity at the crystal grain boundaries.

While the crystalline silicon films shown in FIGS. 21A and 21B have the continuity at the crystal grain boundaries at the similar level, there is a great difference in the number of defects in the crystal grains. It is considered that the reason why the crystalline silicon film of the invention has far higher electric characteristics than the crystalline silicon film shown in FIG. 21A greatly resides in the difference in the number of defects.

The inventors consider the following model for the phenomenon occurring in the step of FIG. 6C. In the state shown in FIG. 21A, the catalytic element (typically nickel) are segregated at the defects (mainly stacking faults) in the crystal grains. It is therefore considered that there are a large number of bonds such as an Si—Ni—Si bond.

The Si—Ni bond is severed when Ni present at the defect is removed by performing the gettering process of the catalytic element, and then the remaining unpaired bonds of silicon immediately form an Si—Si bond, so as to be stabilized. The defect is thus dispelled.

While it has been known that a thermal annealing at a high temperature dispels a defect in a crystalline silicon film, it is considered that a large number of unpaired bonds are generated by severing a bond with nickel, and recombination of silicon proceeds smoothly.

At the same time as the above, surplus silicon atoms formed on thermal oxidation of the crystalline silicon film migrate to the defects to greatly contribute the formation of Si—Si bonds. This concept is known as a reason why the high temperature polysilicon film contains less defects in the crystal grains.

The inventors also consider the model in which the crystalline silicon film and the underlying firmly stick together to heighten the adhesion between them by conducting a heat treatment at a temperature (from 700 to 1,100° C.) higher than the crystallization temperature, and thus a defect is dispelled.

The thermal expansion coefficient of the crystalline silicon film is different from that of the silicon oxide film as the undercoat film by nearly 10 times. Therefore, in the step where the amorphous silicon film is converted into the crystalline silicon film as in FIG. 21A, a great stress is applied to the crystalline silicon film when the crystalline silicon film is cooled.

Figure 22A:
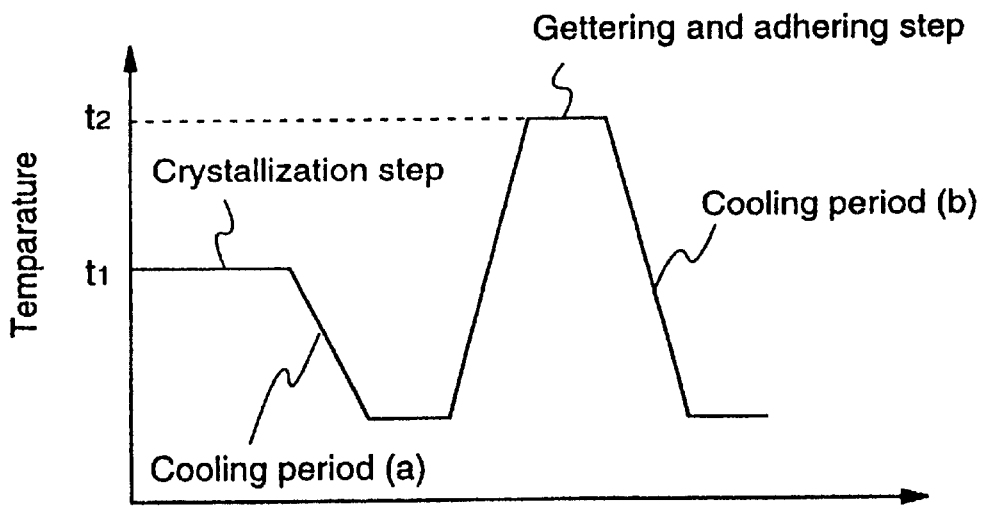
FIGS. 22A to 22C are schematic diagrams showing the model of formation and disappearance of defects.
Figure 22B:
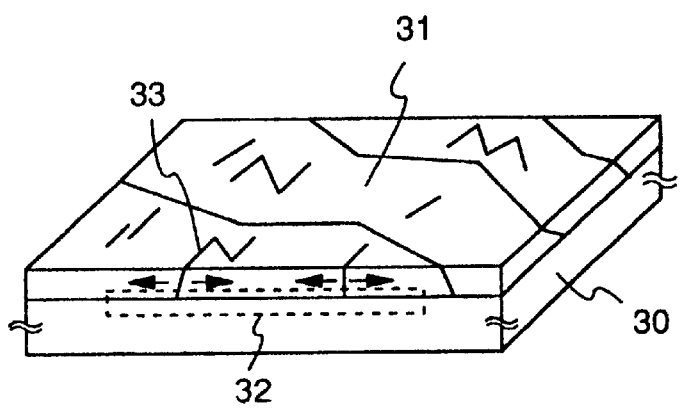
Figure 22C:
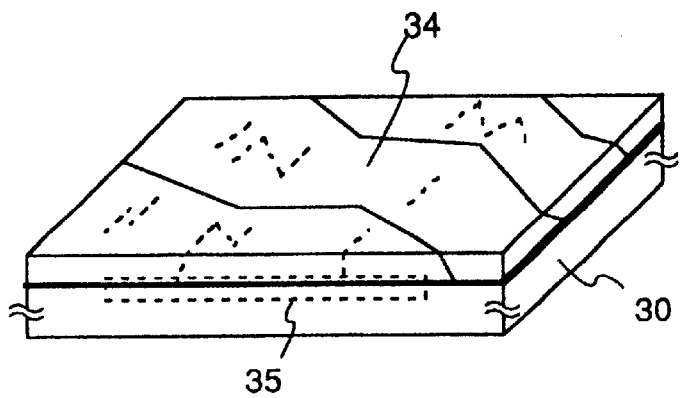

This is explained by referring to FIGS. 22A to 22C. FIG. 22A shows a thermal history of the crystalline silicon film after the crystallization step. The crystalline silicon film is crystallized at the temperature $t_1$ and then cooled to room temperature over the cooling period (a).

FIG. 22B shows the crystalline silicon film in the cooling period (a), in which 30 denotes the substrate having an insulating surface and 31 denotes the crystalline silicon film. The adhesive force at the interface 32 of the crystalline silicon film 31 and the substrate 30 is not so high, and it is considered that many defects are formed in the grains due to such phenomenon.

The crystalline silicon film 31 stretched due to the difference in thermal expansion coefficient is very movable on the substrate 30, and defects 33, such as stacking defects and dislocation, are easily formed by a force such as a tensile force.

The crystalline silicon film in this state is shown in FIG. 21A. The crystalline silicon film is then subjected to the gettering step of the catalytic elements at the temperature $t_2$ as shown in FIG. 22A, and as a result, the defects in the crystalline silicon film are disappeared by the reasons described above.

What is important in this step is that at the same time as the gettering step being performed, the crystalline silicon film is firmly adhered on the substrate having an insulating surface, and adhesive force to the substrate is heightened. Accordingly, it is considered that the gettering step also serves as a adhering step between the crystalline silicon film and the substrate (undercoat).

After completing the gettering and adhering step, the crystalline silicon film is cooled to room temperature over the cooling period (b). What is different from the cooling period (a) is that the adhesive force at the interface 35 between the substrate 30 and the crystalline silicon film 34 after annealing is extremely high, as shown in FIG. 22C.

Since the crystalline silicon film 34 is completely adhered to the substrate 30, no defect is formed even when a stress is applied to the crystalline silicon film in the cooling period of the crystalline silicon film. Thus, it can be prevented that defects are again formed.

While the process in which the temperature is decreased to room temperature after the crystallization step is exemplified in FIG. 22A, the temperature can be immediately increased after completing the crystallization to conduct the gettering and adhering step. The crystalline silicon film of the invention can also be obtained such a process.

The crystalline silicon film of the invention thus obtained shown in FIG. 21B has characteristics in that the number of defects in the crystal grains is extremely smaller than the crystalline silicon film subjected only to the crystallization shown in FIG. 21A.

The difference in the number of defects is reflected to the difference in the spin density in electron spin resonance (ESR) analysis. It is confirmed that the spin density of the crystalline silicon films of the invention is $5 \times 10^{17}$ spins/cm$^3$ or less (preferably $3 \times 10^{17}$ spins/cm$^3$). However, because this value of spin density is close to the lower detection limit of the currently available measurement device, the actual spin density is considered to be lower than this value.

The inventors call the crystalline silicon films having the above-described crystalline structure and characteristics as a "continuous grain silicon (CGS)".

The coincidence boundary described above is formed only between crystal grains having the same plane azimuth. Because the semiconductor thin film of the invention has the plane azimuth substantially uniformly arranged in {110}, such coincidence boundaries are formed in a wide area. This characteristic feature of the invention cannot be realized in the other polysilicon films where the plane azimuth is irregular.

Figure 24A:
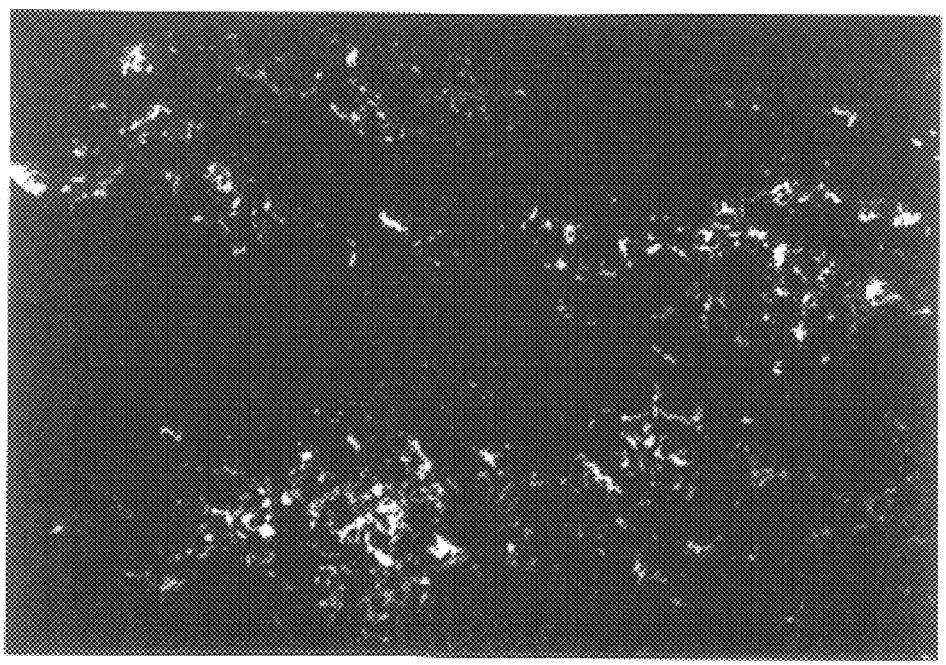
FIGS. 24A and 24B are TEM photographs showing dark-field images of the semiconductor thin film.

FIG. 24A shows a TEM photograph (dark-field image) of the semiconductor thin films of the invention at a magnification of 15,000. However there are white regions and black regions, it is indicated that regions having the same color have the same orientation.

It is noted in FIG. 24A that even in the dark-field image of such a wide area, the white regions continuously get together in such a high extent. This means that crystal grains having the same orientation are present in a certain direction, and the neighboring crystal grains have substantially the same orientation.

Figure 24B:
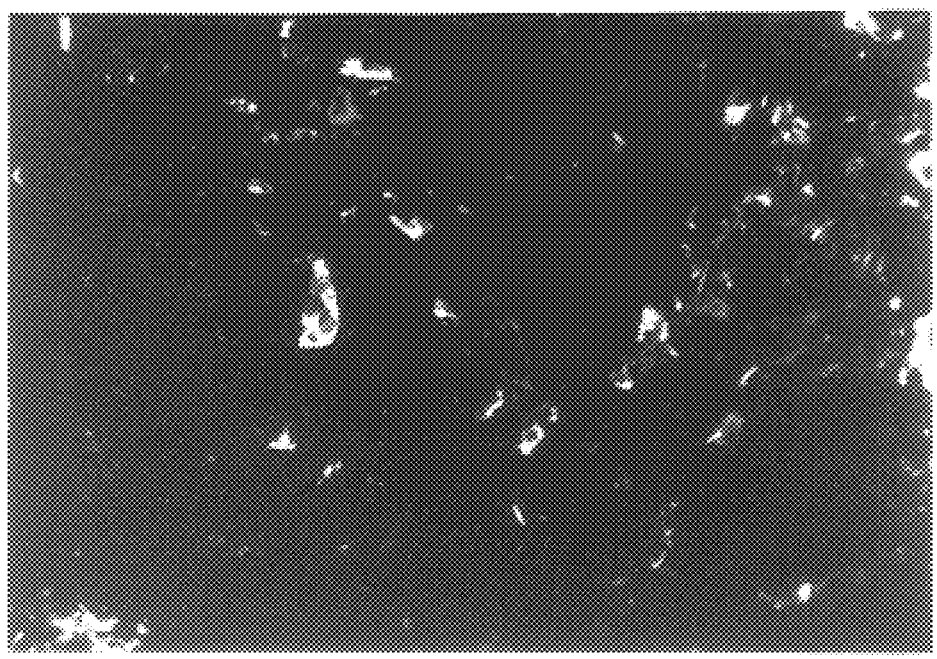

FIG. 24B shows a TEM photograph (dark-field image) of the conventional high temperature polysilicon film at a magnification of 15,000. In the conventional high temperature polysilicon film, the regions having the same plane azimuth are scattered, and the gathered part in the certain direction as in FIG. 24A cannot be found. It is considered that this is because the orientation of the neighboring crystal grains is entirely irregular.

The inventors conduct repeated observations and measurements throughout a large number of regions other than the measured region shown in FIG. 23A, and confirm that the continuity of the crystal lattice at the crystal grain boundaries is maintained in a wide area sufficient to produce a TFT.

EXAMPLE 5

The example of using a halogen element in the gettering step of the catalytic element is shown in Example 4. In this Example, phosphorous is used in the gettering step of the catalytic element.

Figure 8A:
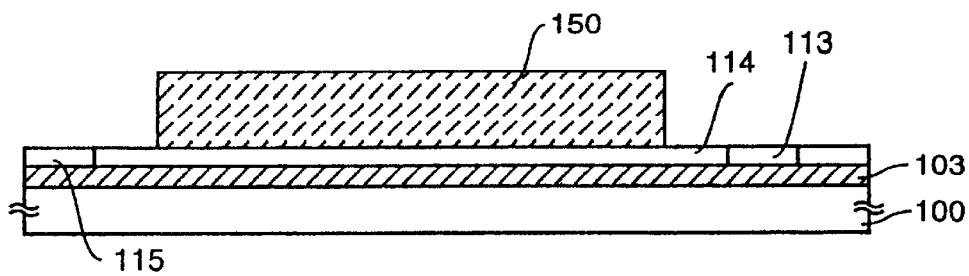
FIGS. 8A to 8D are showing a manufacturing process of a semiconductor device.

In the case using phosphorous, phosphorous is added to the other region 151 become the active layer. As a method for adding phosphorous, after completing crystallization by using the catalytic element, a resist 150 is formed covering the region to be the active layer as shown in FIG. 8A.

Figure 8B:
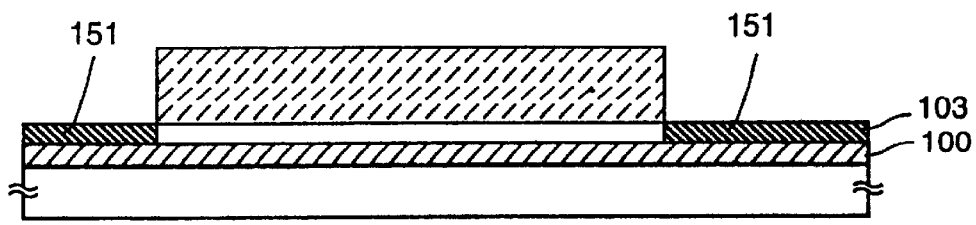

Phosphorous ions are provided by a spin coating method or injected by an ion doping method as shown in FIG. 8B. Phosphorous ions are added to the region 151 shown in FIG. 8B.

Figure 8C:
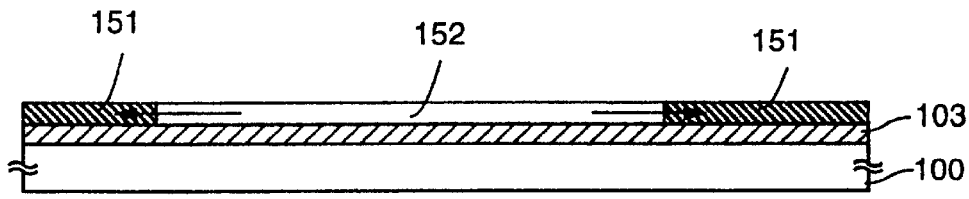

The heat treatment is then performed at a temperature of from 400 to 1,050° C. (preferably from 600 to 750° C.) for from 1 minute to 20 hours (typically from 30 minutes to 3 hours) as shown in FIG. 8C.

The catalytic element is subjected to gettering to the region 151 to which phosphorous is added, and thus the concentration of the catalytic element in the region 152 is reduced to $5 \times 10^{17}$ atoms/cm$^3$ or less.

Figure 8D:
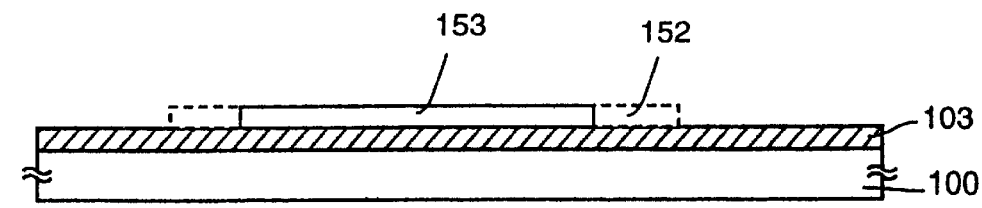

After completing the gettering step, the active layer 153 is formed by utilizing the region other than the region to which phosphorous is added as shown in FIG. 8D.

A gate insulating film is then formed, and a gate electrode, a source region, a drain region and a channel region are formed by the known process to produce a semiconductor device.

In the step of FIG. 8C, when a heat treatment (gettering treatment) is performed in an atmosphere containing a halogen element for forming a thermal oxidized film as the gate insulating film, a synergistic effect of the gettering effect by phosphorous in this Example and the gettering effect by the halogen element can be obtained.

EXAMPLE 6

An example of a production process of a reflection type liquid crystal panel is explained.

As the undercoat film, one produced according to the manufacturing process of Examples 1 to 3 is used.

Figure 9:
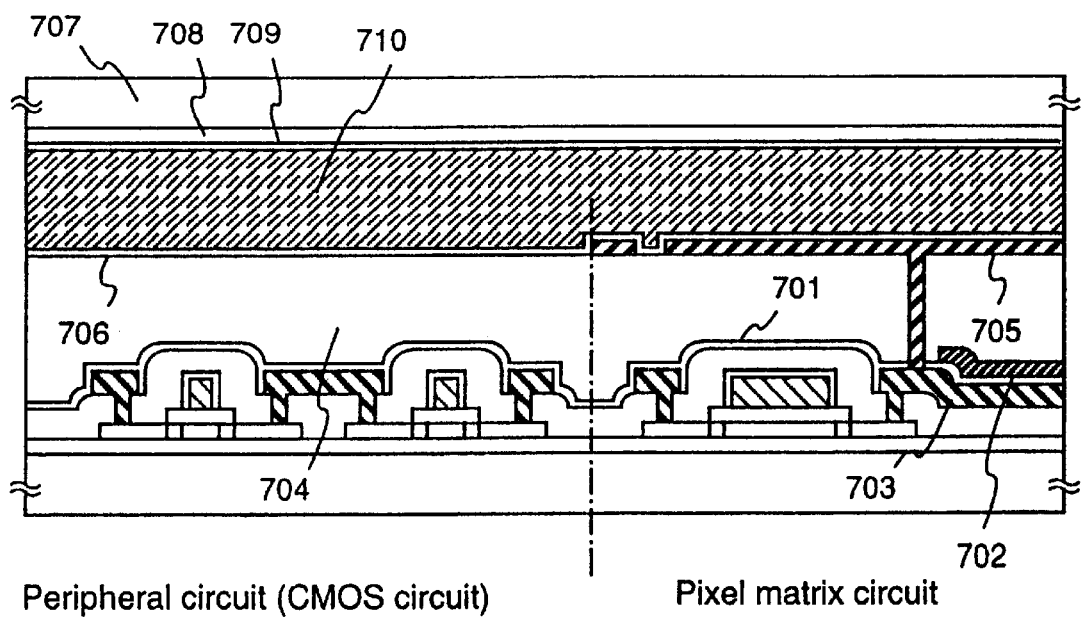
FIG. 9 is a cross sectional view of a electro-optical device.

What is shown in FIG. 9 is a cross sectional view of an active matrix liquid crystal panel, in which a CMOS circuit is shown for a driver circuit and a logic circuit, and a pixel TFT is shown for a region constituting pixel matrix circuits.

The CMOS circuit is produced by complementarily combining an N-channel TFT and a P-channel TFT. The manufacturing process of the individual TFTs is not repeated since it has been described in Example 4.

The pixel TFT is produced by further modifying the TFT constituting the driver circuit. In FIG. 9, numeral 701 denotes a silicon nitride film, which functions as both a passivation film of the CMOS circuit and an insulator constituting an auxiliary capacitance.

A titanium film 702 is formed on the silicon nitride film 701, and an auxiliary capacitance is formed between the titanium film 702 and a drain electrode 703. Since the insulator is the silicon nitride film having a high relative dielectric constant, the capacitance can be made large. Since the aperture ratio need not be considered in the case of a reflection type liquid crystal panel, the structure shown in FIG. 9 can be used without any problem.

704 denotes an interlayer insulating film composed of an organic resin film, which is made of polyimide in the Example. It is preferred that the thickness of the interlayer insulating film 704 is made as thick as about 2 $\mu$m to keep sufficient flatness. A pixel electrode 705 having sufficient flatness can thus be obtained.

The pixel electrode 705 is produced with aluminum or a material mainly composed of aluminum. It is preferred to use a material having a reflective index as high as possible. By keeping excellent flatness for the pixel electrode, loss by diffused reflection at the pixel electrode surface can be reduced.

An oriented film 706 is formed on the pixel electrode 705. The oriented film 706 has orientation stress by rubbing. These are the constitution of the TFT substrate (active matrix substrate).

The counter substrate is produced by forming a transparent electrode 708 and an oriented film 709 on a transmissible substrate 707. Other than these component, a black mask and a color filter can be provided depending on necessity.

After dispersing spacers and printing sealing materials, a liquid crystal layer 701 is sealed to complete a reflection type liquid crystal panel having the structure shown in FIG. 9. The liquid crystal layer 710 can be freely selected depending on the operation mode (such as ECB mode and guest-host mode) of the liquid crystal.

Figure 10:
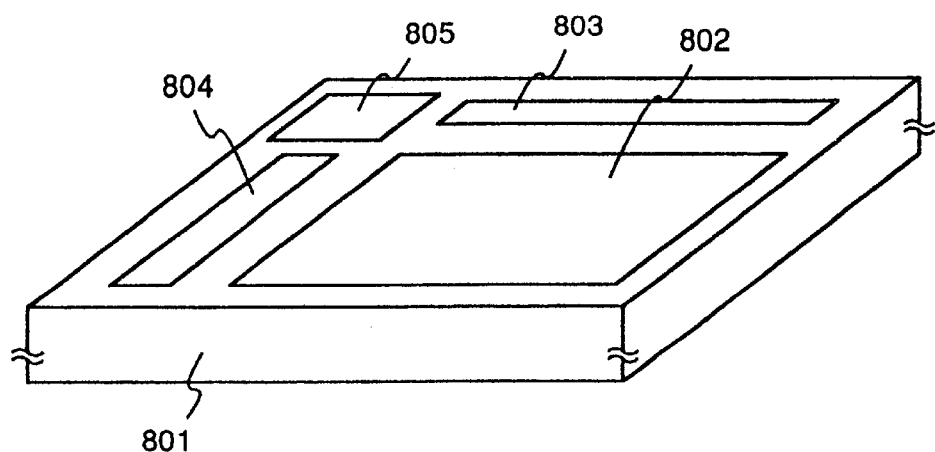
FIG. 10 is showing an appearance of an active matrix substrate.

An appearance of the active matrix substrate constituting the reflection type liquid crystal panel shown in FIG. 9 is schematically shown in FIG. 10. In FIG. 10, numeral 801 denotes a silicon substrate on which a thermal oxidation film is formed by the step of Example 1, 802 denotes a pixel matrix circuit, 803 denotes a source driver circuit, 804 denotes a gate driver circuit and 805 denotes a logic circuit.

The logic circuit 805 involves all logic circuits constituted by a TFT in a broad sense. In order to distinguish from the circuits conventionally called the pixel matrix circuit and the driver circuit, the logic circuit 805 designates other signal processing circuits (such as a memory circuit, a D/A convertor circuit and a clock generator circuit).

An FPC (flexible print circuit) terminal is attached to the thus produced liquid crystal panel. What is generally called a liquid crystal module is a liquid crystal panel equipped with an FPC terminal.

EXAMPLE 7

An example of a production process of a transmission type liquid crystal panel is explained, in which the semiconductor device shown in Example 4 is provided on the undercoat film shown in Examples 1 to 3.

Since the basic structure of the transmission type liquid crystal panel is the same as the reflection type liquid crystal panel shown in Example 6, only the differences in constitution are described here.

Figure 11:
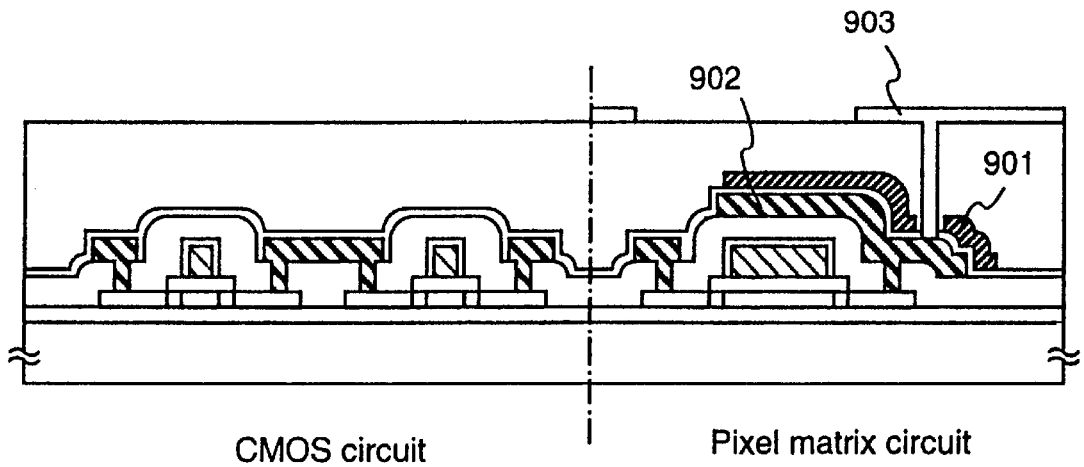
FIG. 11 is a cross sectional view of an active matrix substrate.

In the case of the transmission type liquid crystal panel, the cross sectional view of which is shown in FIG. 11, the constitution of the black mask 901 is greatly different from the reflection type liquid crystal plane. Because the aperture ratio must be large in the transmission type, it is important to use a constitution in which the black mask 901 does not overlap as possible in the region other than the TFT part and the circuit part.

Therefore, in this Example, the drain electrode 902 is formed on the TFT to overlap it, and an auxiliary capacitance is formed between the black mask 901 and the drain electrode 902. By producing the auxiliary capacitance, which is liable to occupy a large area, on the TFT, the aperture ratio can be made large.

903 denotes a transparent conductive film as a pixel electrode. While ITO is frequently used as the transparent conductive film 903, other materials such as tin oxide series material can also be used.

EXAMPLE 8

An example where the invention is applied to a silicon gate TFT using a silicon film having conductivity as a gate electrode is described in this Example. Since the basic structure is the same as the TFT produced in Example 4, the differences in constitution are described here.

Figure 12:
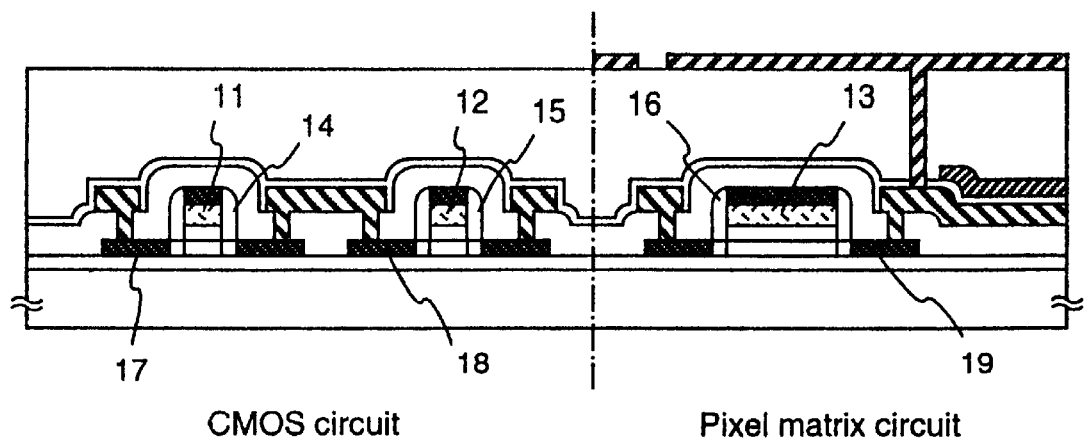
FIG. 12 is a cross sectional view of an active matrix substrate.

In FIG. 12, numeral 11 denotes a gate electrode of an N-channel TFT, 12 denotes a gate electrode of a P-channel TFT, and 13 denotes a gate electrode of a pixel TFT. As the gate electrodes 11 to 13, an N-type polysilicon film added with phosphorous or arsenic, or a P-type polysilicon film added with boron or indium.

In the CMOS circuit, a dual gate CMOS circuit may be constituted, in which an N-type polysilicon gate is used in the N-channel TFT, and a P-type polysilicon gate is used in the P-channel TFT.

The advantage of using silicon films as the gate electrodes is that the silicon film has high heat resistance and is easy to handle. Furthermore, a salicide structure (including a polycide structure) utilizing a reaction with a metallic film may also be used.

In order to use the salicide structure, after forming the gate electrode 11 to 13, side walls 14 to 16 are formed. Metallic films (not shown in Figure) of titanium or tungsten are then formed, and a heat treatment is performed to form metallic silicides 17 to 19. The metallic silicides 17 to 19 are formed at a part of the source/drain region and the gate electrode.

This structure where a metallic silicide is formed by using the side wall is called a salicide structure. This structure is useful since the ohmic contact with the pick-up electrode (such as a source/drain electrode) becomes good.

EXAMPLE 9

The TFT according to the invention exhibits electric characteristics equivalent to a MOSFET using a single crystal silicon because the TFT of the invention uses the semiconductor thin film that can be substantially considered as a single crystal as the active layer.

The TFT obtained in the invention has excellent switching characteristics and high speed operation characteristics. Therefore, an integrated circuit such as an LSI that has been constituted with an MOSFET can be constituted with a TFT.

Furthermore, owing to the advantage of TFT using thin films, a three-dimensional semiconductor device (a semiconductor circuit) can be produced.

Figure 13A:
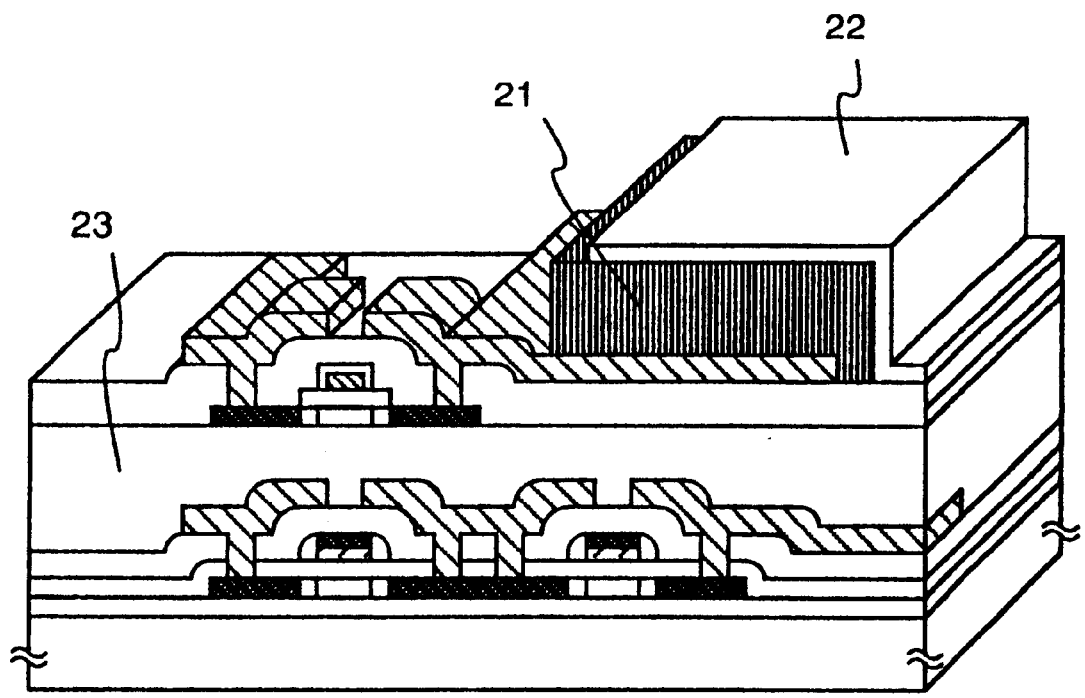
FIGS. 13A and 13B are cross sectional views of an example of a semiconductor circuit.
Figure 13B:
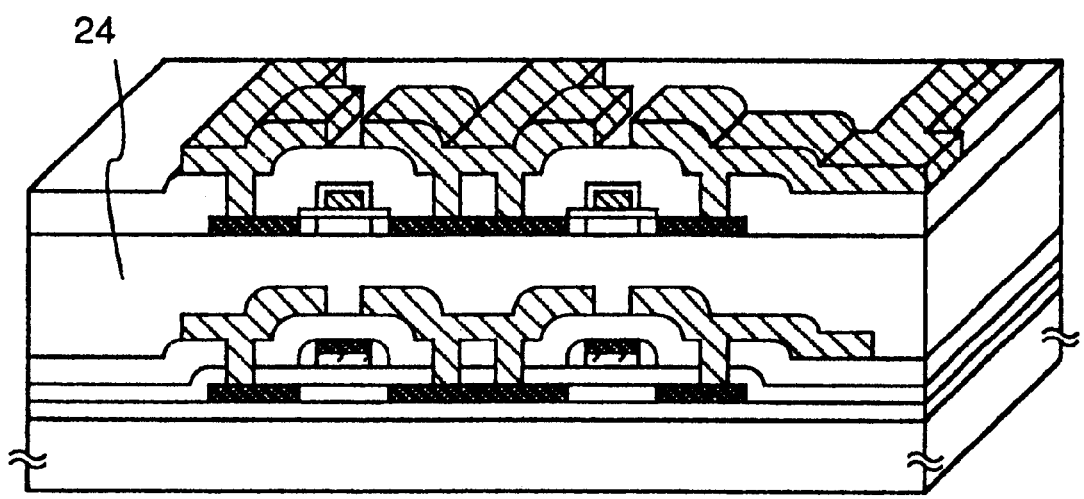

Examples of semiconductor circuits having a three-dimensional structure using the TFT of the invention are shown in FIGS. 13A and 13B. A three-dimensional circuit composed of a TFT layer as a lower layer and an image sensor as a upper layer is shown in FIG. 13A. A three-dimensional circuit composed of two TFT layers as lower and upper layers is shown in FIG. 13B.

In FIG. 13A, numeral 21 denotes a photoelectric conversion layer, and an amorphous silicon film can be used therefor. An upper electrode (a transparent conductive film) 22 is formed thereon to from a receptor at which light is received and converted into an electric signal.

The production process of the TFT is omitted here since it has been described in Example 4. As the lamination technique to produce the three-dimensional circuit, known processes can be used. Upon producing the upper TFT layer, the heat resistance of the lower TFT layer must be considered.

For example, it is possible that the TFT of the invention is used as the lower layer, and the conventional TFT produced at low temperatures is used as the upper layer. It is also possible that the lower layer TFT is produced with materials having high heat resistance, and the upper layer is made with the TFT of the invention.

The image sensor as the upper layer may be such a structure that the receptor of the upper layer is controlled by the TFT of the lower layer composed only of a receptor.

In FIG. 13B, the lower layer is a TFT layer using a silicon gate structure, and the upper layer is a TFT layer using a silicon gate structure or a structure using other metallic films (such as films mainly composed of aluminum) as the gate electrode. With respect to FIG. 13B, the structure of the TFT is omitted here.

In this structure, on producing the TFT of the upper layer, the heat resistance of the TFT of the lower layer must be considered.

In both cases of FIGS. 13A and 13B, it is preferred that relatively thicker interlayer insulating films 23 and 24 are formed after forming the TFT of the lower layer, and after polishing the interlayer insulating films with CMP (chemical mechanical polishing) to be flattened, the TFT of the upper layer is then formed.

A semiconductor circuit having excellent functionality can be produced by forming a three-dimensional semiconductor circuit using the TFT of the invention. The term semiconductor circuit used herein means an electric circuit that conducts control or conversion of an electric signal by utilizing the semiconductor characteristics.

A driver circuit for an LCD and a high frequency circuit (MMIC: microwave module IC) can be produced by using the TFT of the invention. By using the TFT of the invention, conventional IC chips and LSI chips can be produced with a TFT.

EXAMPLE 10

According to the invention, other electro-optical devices than a liquid crystal display device, such as an active matrix type EL (electroluminescence) display device and an EC (electrochromics) display device, can be produced.

The term electro-optical device used herein means a device converting an electric signal into an optical signal and vice versa.

EXAMPLE 11

Examples of electronic apparatuses (application apparatuses) using an electro-optical device utilizing the invention are shown in FIGS. 14A to 14F. The term electronic apparatus used herein means a product equipped with a semiconductor circuit and/or an electro-optical device.

Examples of the electronic apparatuses to which the invention can be applied include a video camera, an electronic still camera, a projection display, a head mounted display, a car navigation system, a personal computer and a portable information terminal (e.g., a portable computer, a cellular phone and a PHS (personal handy phone system)).

FIG. 14A shows a cellular phone, which is composed of a main body 2001, a sound output part 2002, a sound input part 2003, a display device 2102, an operation switch 2005 and an antenna 2006. This invention can be applied to the sound output part 2002, the sound input part 2003, the display device 2004, etc.

FIG. 14B shows a video camera, which is composed of a main body 2101, a display device 2102, a sound input part 2103 and an image receiving part 2106. This invention can be applied to the display device 2102, the sound input part 2103, the image receiving part 2106, etc.

FIG. 14C shows a portable computer, which is composed of a main body 2201, a camera part 2202, an image receiving part 2203, an operation switch 2204 and a display device 2205. This invention can be applied to the camera part 2202, the image receiving part 2203, the display device 2205, etc.

FIG. 14D shows a head mounted display, which is composed of a main body 2301, a display device 2302 and belt part 2303. This invention can be applied to the display device 2302.

FIG. 14E shows a projection display of rear projection type, which is composed of a main body 2401, a light source 2402, a display device 2403, reflectors 2405 and 2406, and a screen 2407. This invention can be applied to the display device 2403.

FIG. 14F shows a projection display of front projection type, which is composed of a main body 2501, a light source 2503, a display device 2503, an optical system 2504 and a screen 2505.

As described above, the application field of the invention is extremely wide, and the invention can be applied to electronic apparatuses of any field. The invention can be applied to any product that requires an electro-optical device or a semiconductor circuit.

The above Examples are described by referring to the production process of a planar TFT, but the invention can be applied irrespective to the TFT structure. That is, the TFT structure is not limited to those shown in FIGS. 7A to 7D and 9, and the invention can be easily applied to structures such as an inverse stagger TFT, a silicide structure and a side wall structure depending on the necessity of a practician.

The surface of the semiconductor film formed on the undercoat layer of good quality according to the invention has excellent flatness, and formation of defects such as Si cutout can be prevented.

In the case where the semiconductor thin film formed on the undercoat film of the invention is crystallized, the semiconductor thin film has extremely good crystallinity.

By using the semiconductor thin film formed on the undercoat film having a surface of good quality as the active layer, the uniformity of the TFT characteristics, the reliability and the yield can be improved.

What is claimed is:

1. A method of manufacturing a semiconductor device comprising a thin film transistor on an insulating surface comprising the steps of:
    forming a first amorphous semiconductor film in contact with a substrate;
    flattening said first amorphous semiconductor film;
    heat treatment of said first amorphous semiconductor film to obtain a silicon oxide film; and
    forming a second amorphous semiconductor film on said silicon oxide film.

2. A method of manufacturing a semiconductor device comprising a thin film transistor on an insulating surface comprising the steps of:
    forming an insulating film on a substrate;
    flattening said insulating film;
    heat treating said insulating film; and
    forming an amorphous semiconductor film on said insulating film.

3. A method of manufacturing a semiconductor device comprising a thin film transistor on an insulating surface comprising the steps of:
    thermally oxidizing a surface of a single crystal substrate to form an oxide film;
    flattening said oxide film;
    heat treating said oxide film again; and
    forming an amorphous semiconductor film on said oxide film.

4. The method of manufacturing a semiconductor device according to claim 1, 2 or 3, wherein said flattening step is performed by mechanical polishing.

5. The method of manufacturing a semiconductor device according to claim 1, 2 or 3, wherein said flattening step is performed by chemical mechanical polishing.

6. The method of manufacturing a semiconductor device according to claim 1, 2 or 3, wherein said flattening step is performed by electrolytic in-process dressing.

7. A method of manufacturing a semiconductor device comprising the steps of:
    forming an amorphous film comprising silicon over a substrate;
    flattening a surface of said amorphous film;
    oxidizing said amorphous film after the flattening thereof, thereby forming an insulating oxide film over the substrate;
    forming a thin film semiconductor device on the insulating oxide film.

8. A method according to claim 7, wherein said amorphous film comprises silicon.

9. A method according to claim 7, wherein said amorphous film comprises silicon and germanium.

10. A method according to claim 7, wherein said surface is fattened by electrolytic in-process dressing.

11. A method according to claim 7, wherein said surface is fattened by chemical mechanical polishing.

12. A method of manufacturing a semiconductor device comprising the steps of:
    forming a silicon oxide film over a substrate;
    flattening said silicon oxide film; and
    forming a thin film semiconductor device on the flattened silicon oxide film.

13. A method according to claim 12, wherein said flattening of the silicon oxide film is conducted by chemical mechanical polishing.

14. A method of manufacturing a semiconductor device comprising the steps of:
    forming an interlayer insulating film over at least one semiconductor element;
    flattening said interlayer insulating film by chemical mechanical polishing; and
    forming a think film transistor on the flattened interlayer insulating film.

15. The method according to claim 13, wherein said semiconductor element is a thin film transistor having a crystallized semiconductor film as an active layer thereof.

16. The method according to claim 13, wherein said semiconductor device is an MMIC.

17. A method of manufacturing a semiconductor device comprising the steps of:
    forming an interlayer insulating film over at least an electrode;
    flattening said interlayer insulating film by chemical mechanical polishing; and
    forming a thin film transistor on the flattened interlayer insulating film.

18. The method according to claim 16, wherein said semiconductor device is an MMIC.

19. A method of manufacturing a semiconductor device comprising the steps of:
    forming an interlayer insulating film over at least one semiconductor element;
    flattening said interlayer insulating film by chemical mechanical polishing; and
    forming an image sensor on the flattened interlayer insulating film.

20. The method according to claim 19, wherein said semiconductor element is a transistor.

21. The method according to claim 1, wherein said semiconductor device is selected from the group consisting of a liquid crystal display device and an electroluminescence display device.

22. The method according to claim 1, wherein said semiconductor device is selected from the group consisting of cellular phone, a video camera, a portable computer, a head-mounted display, a projection display, a still camera, and a portable information terminal.

23. The method according to claim 2, wherein said semiconductor device is selected from the group consisting a liquid crystal display device and an electroluminescence display device.

24. The method according to claim 2, wherein said semiconductor device is selected from the group consisting of a cellular phone, a video camera, a portable computer, a head-mounted display, a projection display, a still camera, and a portable information terminal.

25. The method according to claim 3, wherein said semiconductor device is selected from the group consisting of a liquid crystal display device and an electroluminescence display device.

26. The method according to claim 3, wherein said semiconductor device is selected from the group consisting of a cellular phone, a video camera, a portable computer, a head-mounted display, a projection display, a still camera, and a portable information terminal.

27. The method according to claim 7, wherein said semiconductor device is selected from the group consisting of a liquid crystal display device and an electroluminescence display device.

28. The method according to claim 7, wherein said semiconductor device is selected from the group consisting of a cellular phone, a video camera, a portable computer, a head-mounted display, a projection display, a still camera, and a portable information terminal.

29. The method according to claim 12, wherein said semiconductor device is selected from the group consisting of a liquid crystal display device and an electroluminescence display device.

30. The method according to claim 12, wherein said semiconductor device is selected from the group consisting of a cellular phone, a video camera, a portable computer, a head-mounted display, a projection display, a still camera, and a portable information terminal.

31. The method according to claim 14, wherein said semiconductor device is selected from the group consisting of a liquid crystal display device and an electroluminescence display device.

32. The method according to claim 14, wherein said semiconductor device is selected from the group consisting of a cellular phone, a video camera, a portable computer, a head-mounted display, a projection display, a still camera, and a portable information terminal.

33. The method according to claim 17, wherein said semiconductor device is selected from the group consisting of a liquid crystal display device and an electroluminescence display device.

34. The method according to claim 17, wherein said semiconductor device is selected from the group consisting of a cellular phone, a video camera, a portable computer, a head-mounted display, a projection display, a still camera, and a portable information terminal.

35. The method according to claim 19, wherein said semiconductor device is selected from the group consisting of a liquid crystal display device and an electroluminescence display device.

36. The method according to claim 19, wherein said semiconductor device is selected from the group consisting of a cellular phone, a video camera, a portable computer, a head-mounted display, a projection display, a still camera, and a portable information terminal.

* * * * *